United States Patent
Koshimizu et al.

(10) Patent No.: US 7,151,035 B2
(45) Date of Patent: Dec. 19, 2006

(54) SEMICONDUCTOR DEVICE AND MANUFACTURING METHOD THEREOF

(75) Inventors: Makoto Koshimizu, Takasaki (JP); Yasuaki Kagotoshi, Takasaki (JP); Nobuo Machida, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 39 days.

(21) Appl. No.: 10/511,541

(22) PCT Filed: Apr. 16, 2002

(86) PCT No.: PCT/JP02/03764

§ 371 (c)(1),
(2), (4) Date: Oct. 18, 2004

(87) PCT Pub. No.: WO03/088362

PCT Pub. Date: Oct. 23, 2003

(65) Prior Publication Data

US 2005/0181569 A1 Aug. 18, 2005

(51) Int. Cl.
*H01L 21/331* (2006.01)

(52) U.S. Cl. ............... 438/309; 438/312; 438/316; 438/318; 438/320; 438/337; 438/341; 438/348; 438/356; 438/357; 438/358; 438/359; 438/360; 438/361; 438/362; 438/364; 438/369; 257/197

(58) Field of Classification Search ............ 438/309, 438/312, 316, 318, 320, 337, 341, 348, 356–362, 438/364, 369
See application file for complete search history.

(56) References Cited

U.S. PATENT DOCUMENTS 5,326,718 A * 7/1994 Klose et al. ............ 438/504

6,509,242 B1 * 1/2003 Frei et al. ............ 438/312

FOREIGN PATENT DOCUMENTS

| JP | 63-052412 | 3/1988 |
|---|---|---|
| JP | 06-151387 | 5/1994 |
| JP | 2705344 | 10/1997 |
| JP | 10-092833 | 4/1998 |
| JP | 11-176807 | 7/1999 |

OTHER PUBLICATIONS

F. Sato et al., "A super self-aligned selectively grown SiGe base (SSSB) bipolar transistor fabricated by cold-wall UHV/CVD technology", IEEE Trans. ED, vol. 41, Issue 8, Aug. 1994, pp. 1373-1378. (Abstract Only).

* cited by examiner

*Primary Examiner*—Michael Lebentritt
*Assistant Examiner*—Kyoung Lee
(74) *Attorney, Agent, or Firm*—Miles & Stockbridge PC

(57) ABSTRACT

A sidewall-insulation film 9 is provided on a side surface of a first opening portion 8a formed in a base extraction electrode 5B of a hetero-junction bipolar transistor, and a portion of the sidewall-insulation film 9 extends so as to protrude from a surface opposite to a semiconductor substrate 1 toward a main surface of the semiconductor substrate 1 in the base extraction electrode 5B, and protruded length thereof is set to be equal to or smaller than one half of thickness of the insulation film 4 interposed between the main surface of the semiconductor substrate 1 and a lower surface of the base extraction electrode 5B.

11 Claims, 17 Drawing Sheets

SEMICONDUCTOR DEVICE AND MANUFACTURING METHOD THEREOF

TECHNICAL FILED OF THE INVENTION

The present invention relates to a semiconductor device and a manufacturing technique therefor and particularly to a technique effectively applied to a semiconductor device having a hetero-junction bipolar transistor (hereinafter abbreviated as "HBT") and to a manufacturing method for the semiconductor device.

BACKGROUND OF THE INVENTION

A HBT technique has been examined primarily for improving the high-speed performance of the bipolar transistor. A HBT forming method examined by the present inventors is, for example, described as follows.

First, on a semiconductor substrate, a silicon nitride film, a polycrystalline silicon film for forming a base electrode, and a silicon oxide film are deposited in order of this subsequently to a lower layer. Then, after forming a first opening-forming photoresist pattern on the silicon oxide film, the silicon oxide film and the polycrystalline silicon film that are exposed therefrom are etched in order of this. Thereby, a first opening portion is formed in the silicon nitride film and the polycrystalline silicon film in such a manner as to expose a portion of an upper surface of the silicon nitride film from a bottom portion. Then, after forming a sidewall-insulation film on a side surface of the first opening portion, a second opening portion greater in a plane size than the first opening portion is formed in such a manner as to communicate with the first opening portion by removing the silicon nitride film through the first opening portion. From this second opening portion, a main surface of the semiconductor substrate and a portion of a bottom surface side of the polycrystalline silicon film are exposed. Then, in the second opening portion, a dissimilar crystalline layer such as silicon-germanium (SiGe) is made to grow selectively by an epitaxial method. This dissimilar crystalline layer is formed by being made to grow from both an exposed surface side of the semiconductor substrate and an exposed surface side of the polycrystalline silicon film. Thereafter, a polycrystalline silicon film for an emitter electrode is embedded in the first opening portion, and impurities in the polycrystalline silicon film are diffused in the dissimilar crystalline layer to form an emitter region. Note that these HBT forming techniques are disclosed in, for example, Japanese Patent Publication No. 2705344 or Fumihiko Sato, et al., "A Super Aligned Selectively Grown SiGe Base (SSSB) Bipolar Transistor Fabricated by Cold-Wall UHV/CVD Technology", IEEE Trans. ED, Vol. 41, pp. 1373–1378 (1994).

However, it has been found at first by the investigations of the present inventors that the above HBT forming method has the following problems. That is, in the above method, an upper portion of the silicon nitride film on the bottom surface of the first opening portion is slightly etched when the first opening portion is formed. In particular, if the photoresist film is used as an etching mask at the time of forming the first opening portion, the silicon nitride film is easily etched because it is impossible to provide a sufficiently high selective ratio of the polycrystalline silicon film to the silicon nitride film. If the second opening portion is formed after forming the sidewall-insulation film on the side surface of the first opening portion under this condition as described above, a lower portion of the sidewall-insulation film becomes greatly protruded to a side of the second opening portion along a direction orthogonal to the main surface of the semiconductor substrate. If the above-mentioned dissimilar crystalline layer is made to grow under this condition, the growth of the dissimilar crystalline is blocked by the protrusion of the sidewall-insulation film. In particular, since the growth of the dissimilar crystalline is blocked at a portion of a bottom surface side of the polycrystalline silicon film for forming the base electrode, the dissimilar crystalline layer is unsuccessfully connected to the polycrystalline silicon film, whereby there is the problem that base resistance is greatly increased.

An object of the present invention is to provide a technique for being capable of improving reliability of a semiconductor device having a HBT.

The above and other objects and novel features of the present invention will become apparent from the description of this specification and the drawings.

DISCLOSURE OF THE INVENTION

Outlines of representative ones of inventions disclosed by the present application will be briefly described as follows.

That is, the present invention intends to prevent the sidewall-insulation film formed on the side surface of the first opening portion from blocking the growth of the dissimilar crystalline layer formed in the second opening portion communicating with the first opening portion.

Also, outlines of other representative ones of inventions disclosed by the present application will be briefly described as follows.

That is, the present invention has the length of a portion protruding from the inside of the second opening portion longer than zero and equal to or smaller than one half the height of the second opening portion, in the sidewall-insulation film formed on the side surface of the first opening portion.

Also, the present invention has the first opening portion formed by using a hard mask as an etching mask without using a photoresist film as an etching mask.

In addition, the present invention has the sidewall-insulation film provided on each side surface of the first opening portions, which are opened in the polycrystalline film for forming the base electrode and the insulation film laminated thereon, in such a manner as to overlap with the insulation film exposed from each side face of the first opening portions.

BEST MODE FOR CARRYING OUT THE INVENTION

In an embodiment described below, when referring to the number of elements (including number of pieces, values, amounts, ranges, or the like), the number of elements is not limited to a specific number unless otherwise stated, or except the case where the number is apparently limited to a specific number in principle, or the like. The number larger or smaller than the specified number is also applicable. Also, in the embodiment described below, it goes without saying that the components (including element steps or the like) are not always essential unless otherwise stated, or except the case where the components are apparently essential in principle, or the like. Similarly, in the embodiment described below, when the shape of the components and the like, or the positional relation and the like thereof, or the like are mentioned, the substantially approximate and similar shapes and the like are included therein unless otherwise stated, or except the case where it can be conceived that they are apparently excluded in principle, or the like. This condition is also applicable to the numerical value and the range described above. In addition, components having the same functions are denoted by the same reference symbols throughout the drawings for describing the embodiment, and the repetitive description thereof will be omitted.

Figure 17:
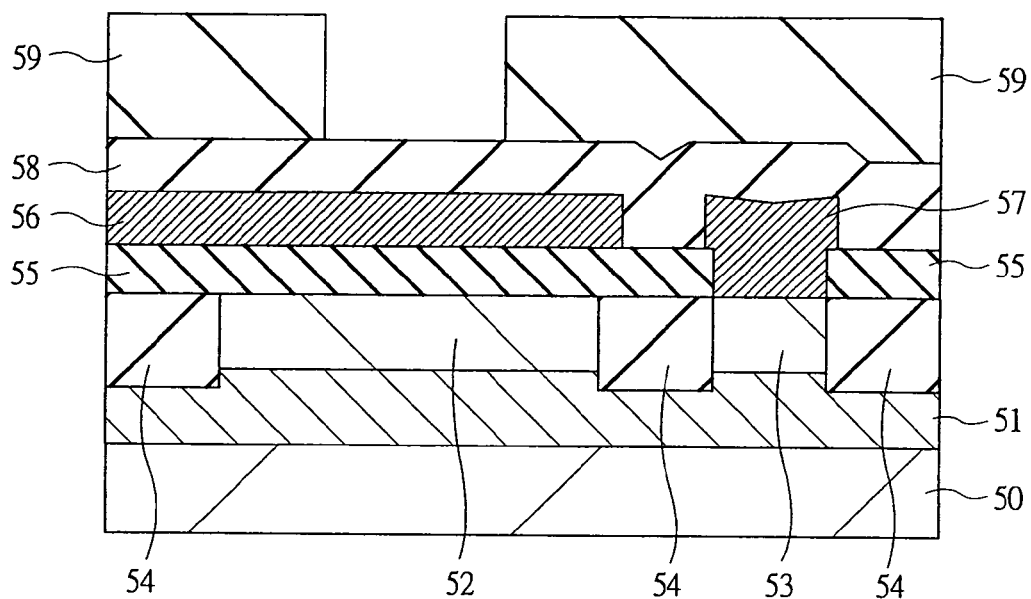
FIG. 17 is a sectional view showing a principal portion in the manufacturing process of the semiconductor device, which the present inventors have examined.

First, a description will be made of one example of an HBT (hetero-junction bipolar transistor) forming method which the present inventors have examined. FIGS. 17 through 22 show sectional views of a principal portion in a HBT forming process thereof. As shown in FIG. 17, on or over a p-type semiconductor substrate 50, an n-type collector embedding region 51 of the HBT, an n$^-$-type collector region 52 of the HBT, and an n$^+$-type collector extraction region 53 are formed. On a main surface of the semiconductor substrate 50, an isolation section 54 is formed. In addition, over the main surface of the semiconductor substrate 50, a silicon nitride film 55, a polycrystalline silicon film 56 for forming an external base electrode, a polycrystalline silicon film 57 for a collector extraction electrode, and a silicon oxide film 58 are formed. Note that a silicon oxide film may be used for the silicon nitride film 55 and a silicon nitride film may be used for the silicon oxide film 58.

Figure 18:
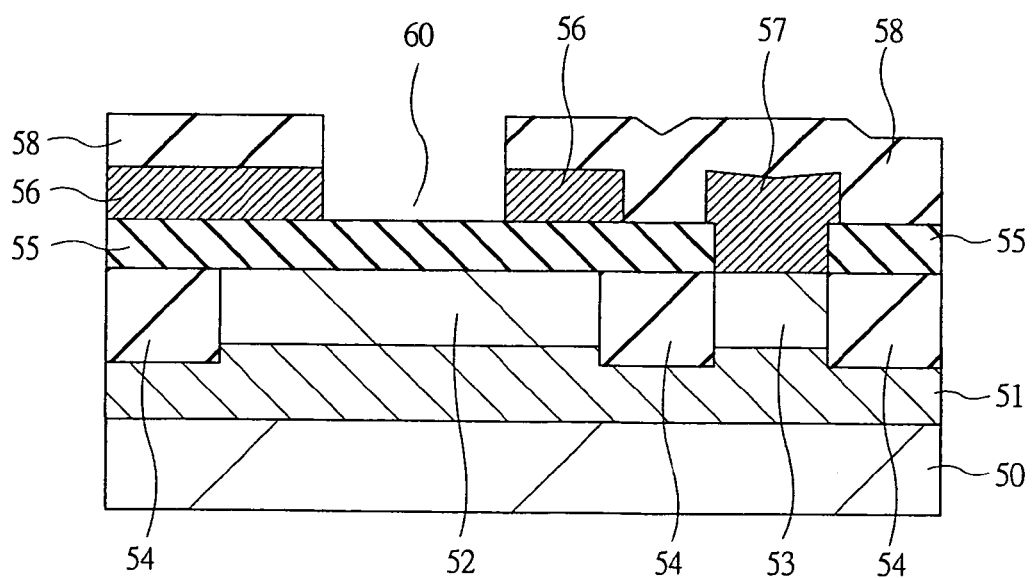
FIG. 18 is a sectional view showing a principal portion in the manufacturing process of the semiconductor device subsequently to FIG. 17.
Figure 19:
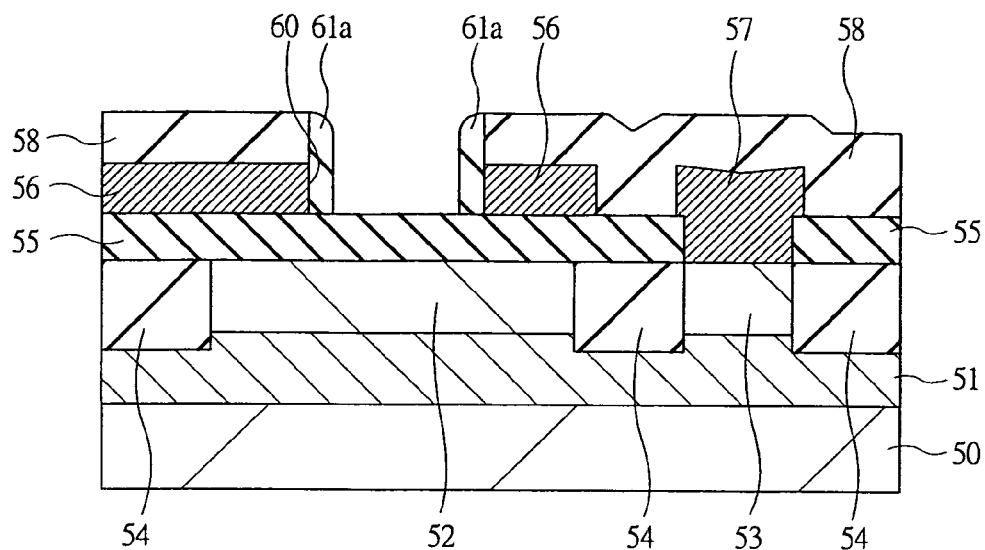
FIG. 19 is a sectional view showing a principal portion in the manufacturing process of the semiconductor device subsequently to FIG. 18.
Figure 20:
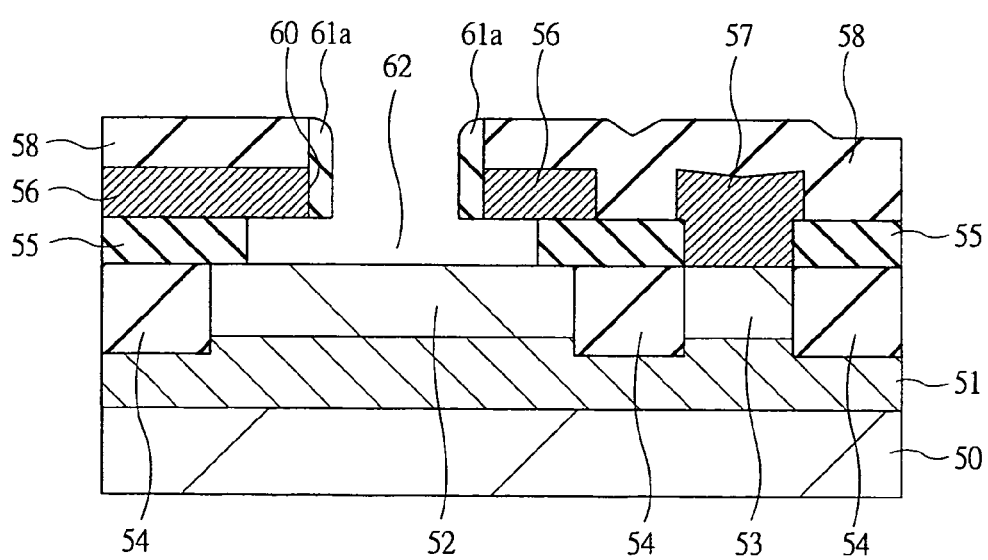
FIG. 20 is a sectional view showing a principal portion in the manufacturing process of the semiconductor device subsequently to FIG. 19.
Figure 21:
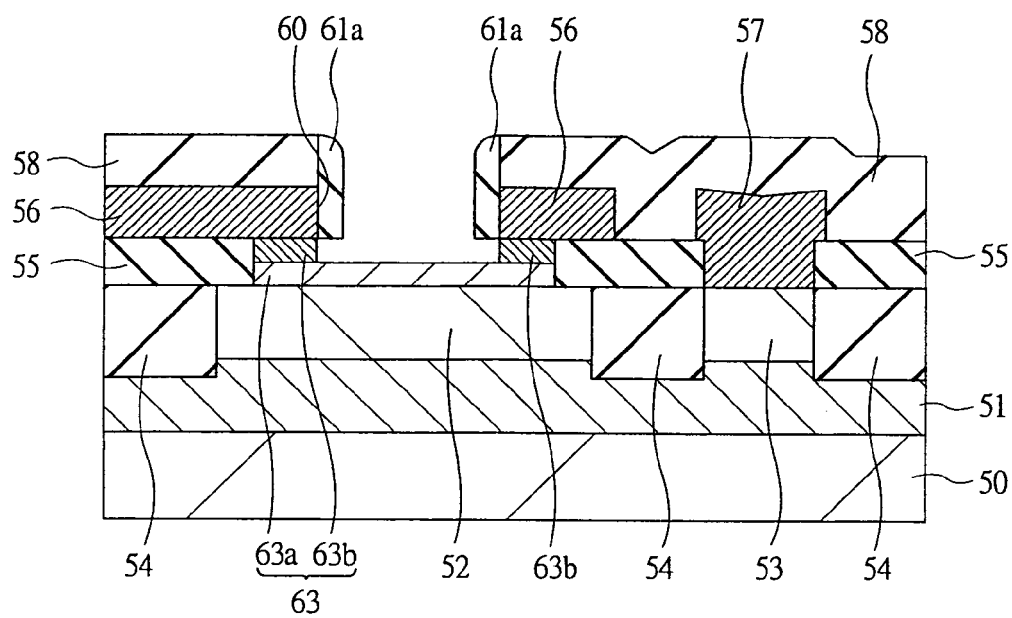
FIG. 21 is a sectional view showing a principal portion in the manufacturing process of the semiconductor device subsequently to FIG. 20.
Figure 22:
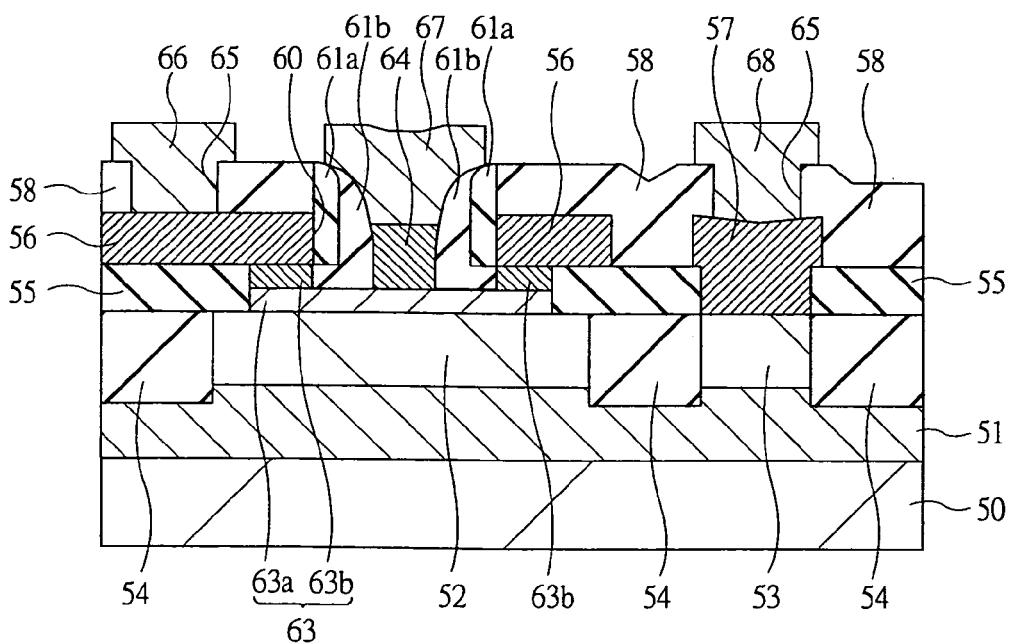
FIG. 22 is a sectional view showing a principal portion in the manufacturing process of the semiconductor device subsequently to FIG. 21.

After forming a photoresist pattern 59 on the silicon oxide film 58 so that an emitter opening region is exposed and a region other than the emitter opening region is covered, the photoresist pattern 59 is used as an etching mask to continuously etch, by an anisotropic dry-etching method, the silicon oxide film 58 and the polycrystalline silicon film 56 exposed from the emitter opening region. By doing so, as shown in FIG. 18, a first opening portion 60, from which a portion of an upper surface of the silicon nitride film 55 is exposed, is formed and thereafter the photoresist pattern 59 is removed. Subsequently, a silicon oxide film is deposited over the main surface of the semiconductor substrate 50 and is etched back to form a first sidewall-insulation film 61a on an inner wall surface of the first opening portion 60 as shown in FIG. 19. Then, by performing a wet-etching treatment to the semiconductor substrate 50 by, for example, phosphoric acid, a portion of the silicon nitride film 55 is removed through the first opening portion 60. At this time, a treatment is performed to such an extent as to etch even the silicon nitride film 55 under the polycrystalline silicon film 56. Thereby this, as shown in FIG. 20, a second opening portion 62 larger than the first opening portion 60 is formed. Subsequently, as shown in FIG. 21, a dissimilar crystalline layer 63 such as silicon-germanium (SiGe) is made to epitaxially grow in the second opening portion 62 with portions of the semiconductor substrate 50 and polycrystalline silicon film 56 being exposed in the second opening portion 62. At this time, a crystalline SiGe layer 63a grows over the semiconductor substrate 50 and a polycrystalline SiGe layer 63b grows on an exposed surface of the polycrystalline silicon film 56. Thereafter, a silicon oxide film is deposited over the main surface of the semiconductor substrate 50 and is etched back, as shown in FIG. 22, to form a second sidewall-insulation film 61b on a side surface of the first sidewall-insulation film 61a provided on the inner wall of the first opening portion 60. Then, a semiconductor film 64 made from single crystalline silicon or polycrystalline silicon is made to epitaxially grow in the first opening portion 60. Then, after forming contact holes 65 in the silicon oxide film 58, electrodes 66, 67, and 68 are formed.

Figure 23:
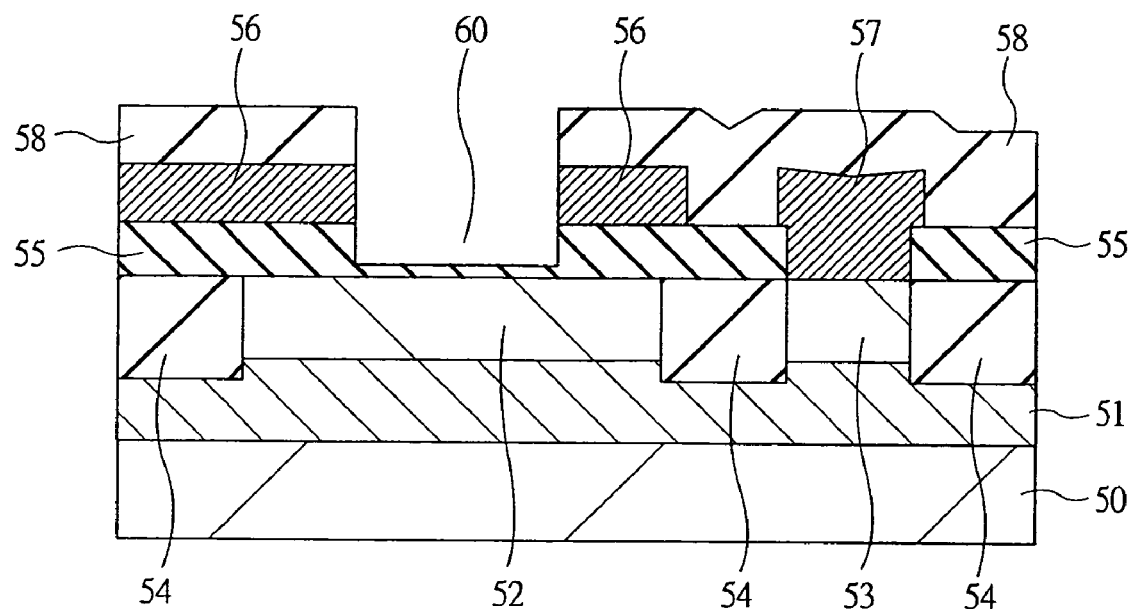
FIG. 23 is a sectional view showing a principal portion in a manufacturing process of a semiconductor device, which is illustrated to explain problems arising in the manufacturing process of each semiconductor device of FIGS. 17 to 22.
Figure 24:
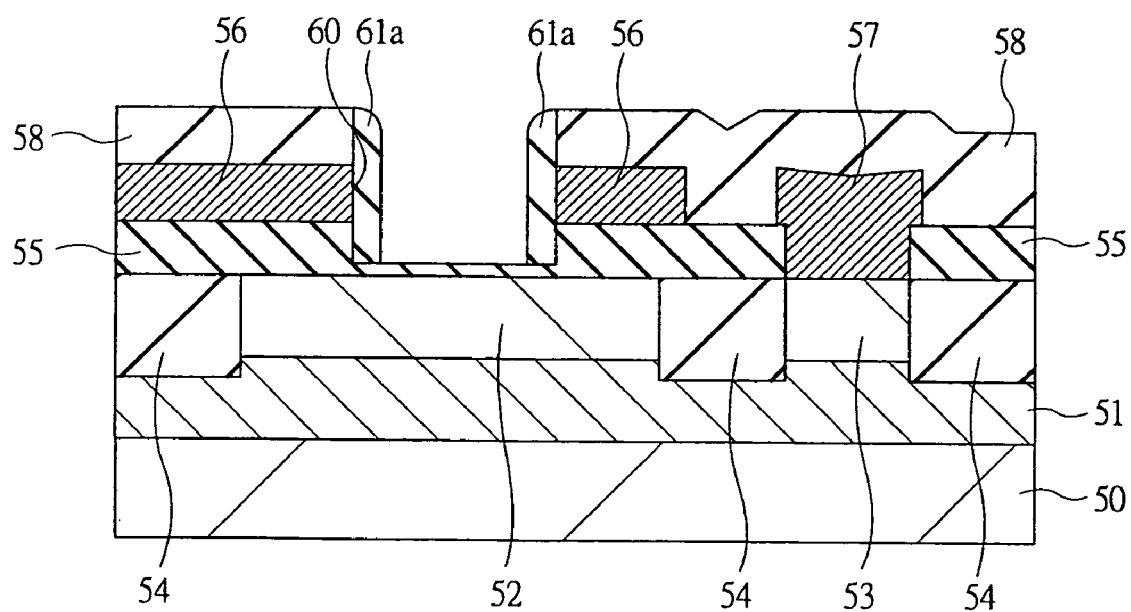
FIG. 24 is a sectional view showing a principal portion in the manufacturing process of the semiconductor device subsequently to FIG. 23.
Figure 25:
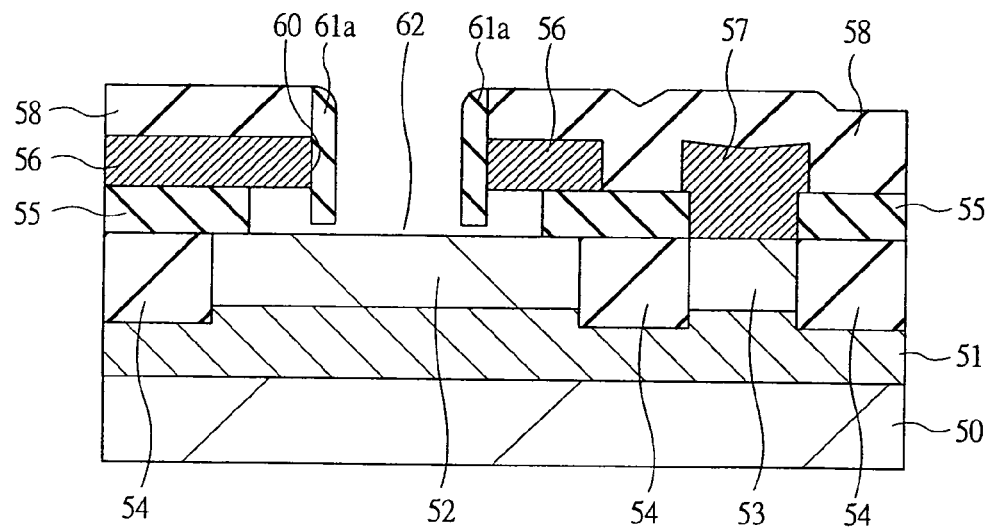
FIG. 25 is a sectional view showing a principal portion in the manufacturing process of the semiconductor device subsequently to FIG. 24.
Figure 26:
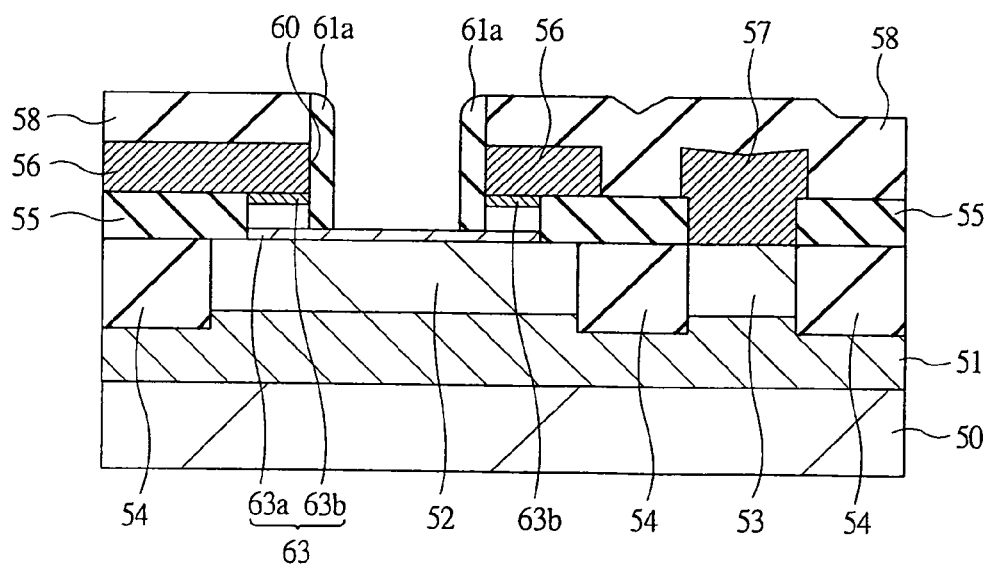
FIG. 26 is a sectional view showing a principal portion in the manufacturing process of the semiconductor device subsequently to FIG. 25.
Figure 27:
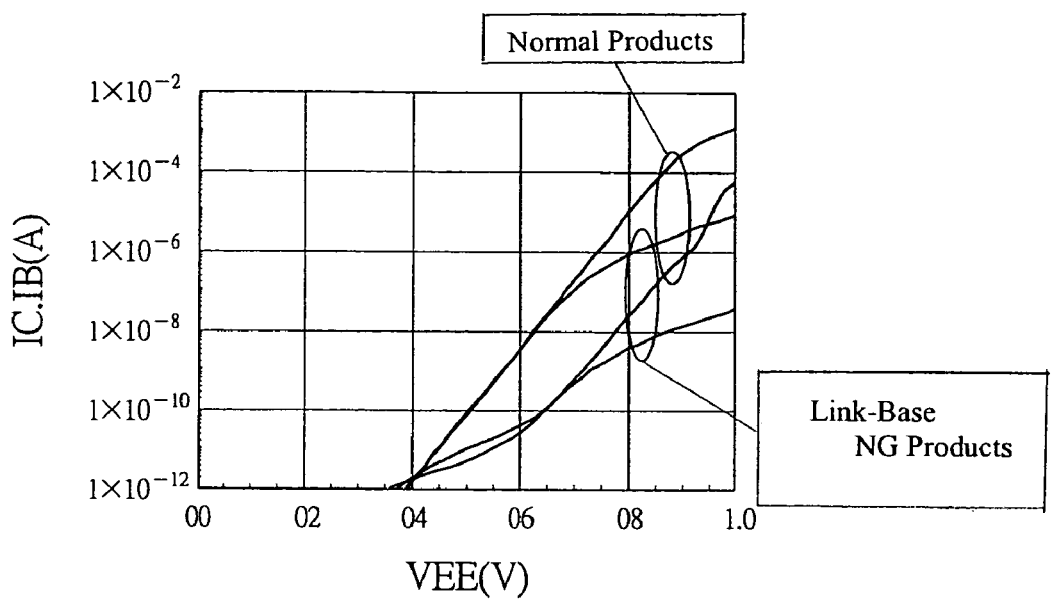
FIG. 27 is a graph indicating gammel plots of a transistor with link-base contact failure and a normal transistor.

However, the present inventors have found out at first that this HBT forming method has the following problems. FIGS. 23 through 26 are sectional views showing a principal portion in the HBT forming process to explain the problems. FIG. 23 is a sectional view showing a principal portion of the semiconductor substrate 50 in the same process as that of FIG. 18 as described above. FIG. 18 illustrates an ideal state not scraped at an upper portion of the silicon nitride film 55 that is the bottom surface of the first opening portion 60. However, in actuality, as shown in FIG. 23, a portion of the silicon nitride film 55 that is the bottom surface of the first opening portion 60 is etched at an anisotropic overetching stage. This etching amount varies depending on etching apparatuses. However, if the photoresist film is generally used as an etching mask, the etching selective ratio of the polycrystalline silicon film to silicon nitride film is reduced remarkably. The reasons will be later described. For example, in a high-density plasma-etching apparatus using a Cl-based gas, the selective ratio is 7. FIG. 24 is a sectional view showing a principal portion of the semiconductor substrate 50 in the same process as that in FIG. 19. In FIG. 24, a lower portion of the first sidewall-insulation film 61a on the side surface of the first opening portion 60 overlaps with the side surface of the scraped portion of the silicon nitride film 55. Under this state, as shown in FIG. 25, if a portion of the silicon nitride film 55 is retracted by a wet-etching method through the first opening portion 60 to form a second opening portion 62, the lower portion of the first sidewall-insulation film 61a becomes protruded from the second opening portion 62. If a dissimilar crystalline layer such as SiGe is made to grow in such a state that a protrusion amount of this first sidewall-insulation film 61a exceeds one half the thickness of the silicon nitride film 55, as shown in FIG. 26, the first sidewall-insulation film 61a becomes an obstacle and the epitaxial growth on an outer circumferential portion of the second opening portion 62 is blocked. Consequently, it is feared that a single crystalline SiGe layer 63a and a polycrystalline SiGe layer 63b are not connected. Therefore, base resistance at a link-base portion is markedly increased. FIG. 27 shows gammel plots of a HBT having been link-base contact failure due to the protrusion of the first sidewall-insulation film 61a and a normal HBT. Each of abnormal Ic and Ib characteristics in a region where a voltage $V_{BE}$ across base-emitter terminals is 0.7 V or more indicates an extreme increase of base resistance.

Figure 28:
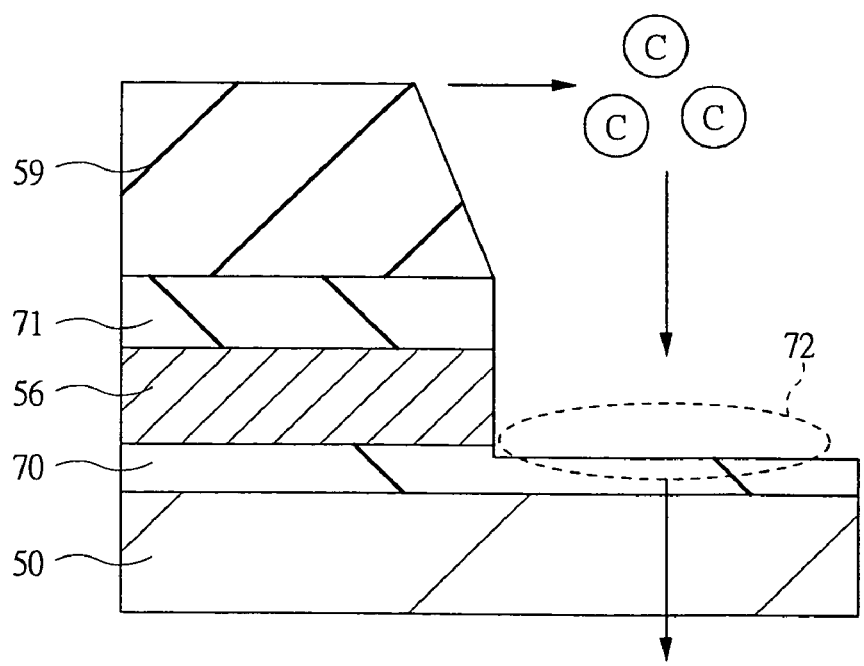
FIG. 28 is a sectional view showing a principal portion of a semiconductor substrate to explain a phenomenon in which an etching selective ratio of a polycrystalline silicon film to a underlying insulation film drops if a photoresist film is used as an etching mask in etching the polycrystalline silicon film by using a chlorine-based gas.

Next, a description will be made of the reasons why the etching selective ratio of the polycrystalline silicon film to the insulation film (silicon oxide film and silicon nitride film) lowers when the photoresist film used as an etching mask is interposed therebetween in etching the polycrystalline silicon film by a chlorine (Cl)-based gas. FIGS. 28 through 31 indicate some models thereof. Reference symbol "70" of FIG. 28 shows a silicon oxide film, reference symbol "71" shows a silicon nitride film, and reference symbol "72" shows a surface of the silicon oxide film 70.

Figure 29:
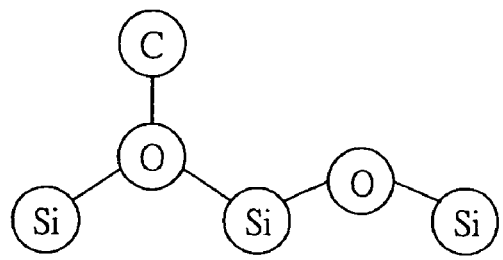
FIG. 29 is an explanatory view for explaining a phenomenon in which an etching selective ratio of a polycrystalline silicon film to a underlying insulation film drops if a photoresist film is used as an etching mask in etching the polycrystalline silicon film by using a chlorine-based gas.
Figure 30:
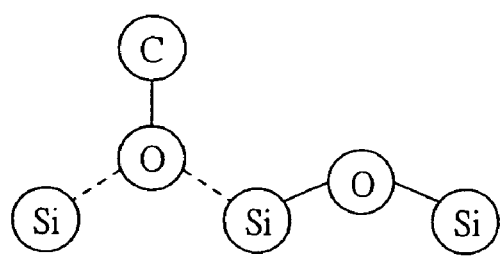
FIG. 30 is an explanatory view for explaining a phenomenon in which an etching selective ratio of a polycrystalline silicon film to a underlying insulation film drops if a photoresist film is used as an etching mask in etching the polycrystalline silicon film by using a chlorine-based gas.
Figure 31:
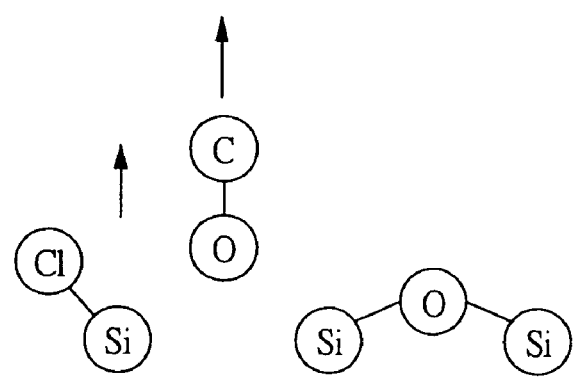
FIG. 31 is an explanatory view for explaining a phenomenon in which an etching selective ratio of a polycrystalline silicon film to a underlying insulation film drops if a photoresist film is used as an etching mask in etching the polycrystalline silicon film by using a chlorine-based gas.

The selective ratio when the polycrystalline silicon film is etched by a dry-etching method using a chlorine-based gas can be explained by the magnitude of binding energy. When no photoresist film exists, Si—Cl binding energy (about 402 kJ/mol) is smaller than Si—O binding energy (465 kJ/mol). Consequently, an etching rate of $SiO_2$ by Cl is extremely slow. That is, the selective ratio is great. In contrast, when the photoresist film is used as an etching mask, carbon(C) exists in a reaction system. That is, since a surface of a photoresist pattern 59 is struck in a dry-etching treatment, as shown in FIGS. 28 and 29, carbon is discharged from the photoresist pattern 59 into a chamber. Meanwhile, since the C—O binding energy (1077 kJ/mol) is stronger than the Si—O binding energy, a Si—O binding force weakens as shown in FIG. 30 if a bond of C—O is formed on the surface 72 of the silicon oxide film 70. If the Si—O binding force weakens, a bond of Si—Cl is formed and etching of the silicon oxide film 70 advances as shown in FIG. 31. That is, the etching selective ratio of the polycrystalline silicon film 56 to the silicon oxide film 70 lowers. This phenomenon becomes more prominent if the silicon nitride film is replaced with the silicon oxide film 70. Consequently, as shown in FIG. 23, when the silicon oxide film 58 and the lower polycrystalline silicon film 56 are etched by using the photoresist pattern 59 as an etching mask in forming the first opening portion 60, an upper portion of the underlying silicon nitride film 55 also is excessively etched, which results in occurrence of the above-mentioned problems.

Therefore, in the present embodiment, the sidewall-insulation film formed on the side surface of the first opening portion is prevented from blocking the growth of the dissimilar crystalline layer formed in the second opening portion. As one example for this, the photoresist film is not used as an etching mask and the hard mask is used as an etching mask to form the first opening portion. In addition, the length of the portion of the sidewall-insulation film protruded to a side of the second opening portion is adjusted so that blocking of the growth of dissimilar crystalline layer is prevented. Hereinafter, one specific example of a manufacturing method for the semiconductor device according to the present embodiment will be described.

The semiconductor device of the present embodiment is one used for telecommunication equipment such as optical transmission systems (photoelectric transfer apparatus etc.), cellular phones, high-frequency discrete products (VCO: voltage controlled oscillator or high-frequency amplifier circuits, etc.), radio (RF: radio frequency) telecommunication equipment (wireless LAN (local area network) or electronic equipment for Bluetooth, etc.).

Figure 1:
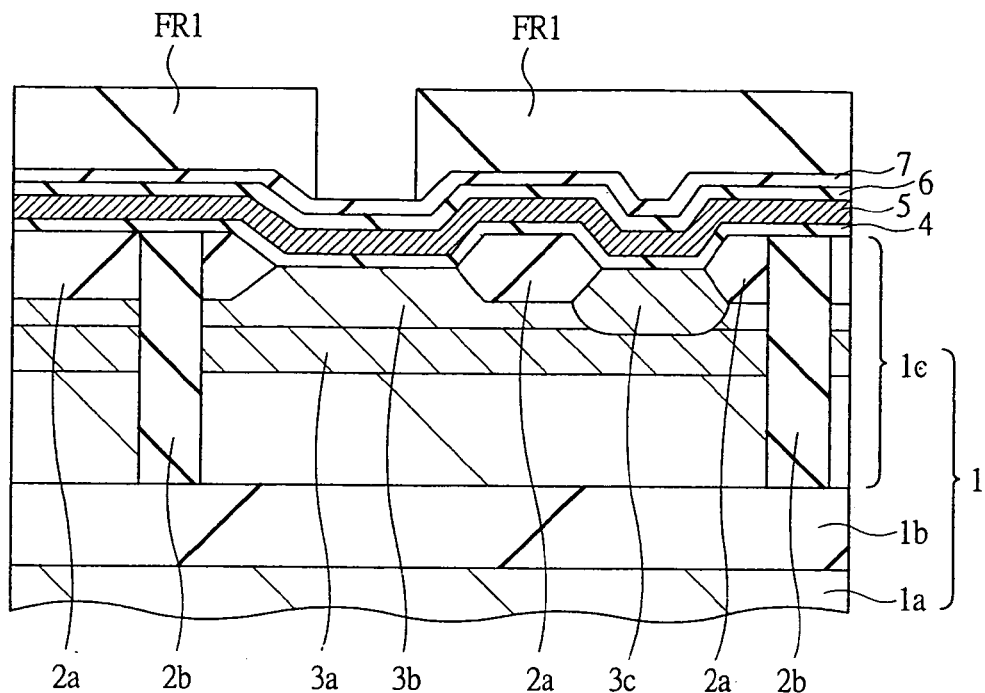
FIG. 1 is a sectional view showing a principal portion in a manufacturing process of a semiconductor device according to an embodiment of the present invention.
Figure 15:
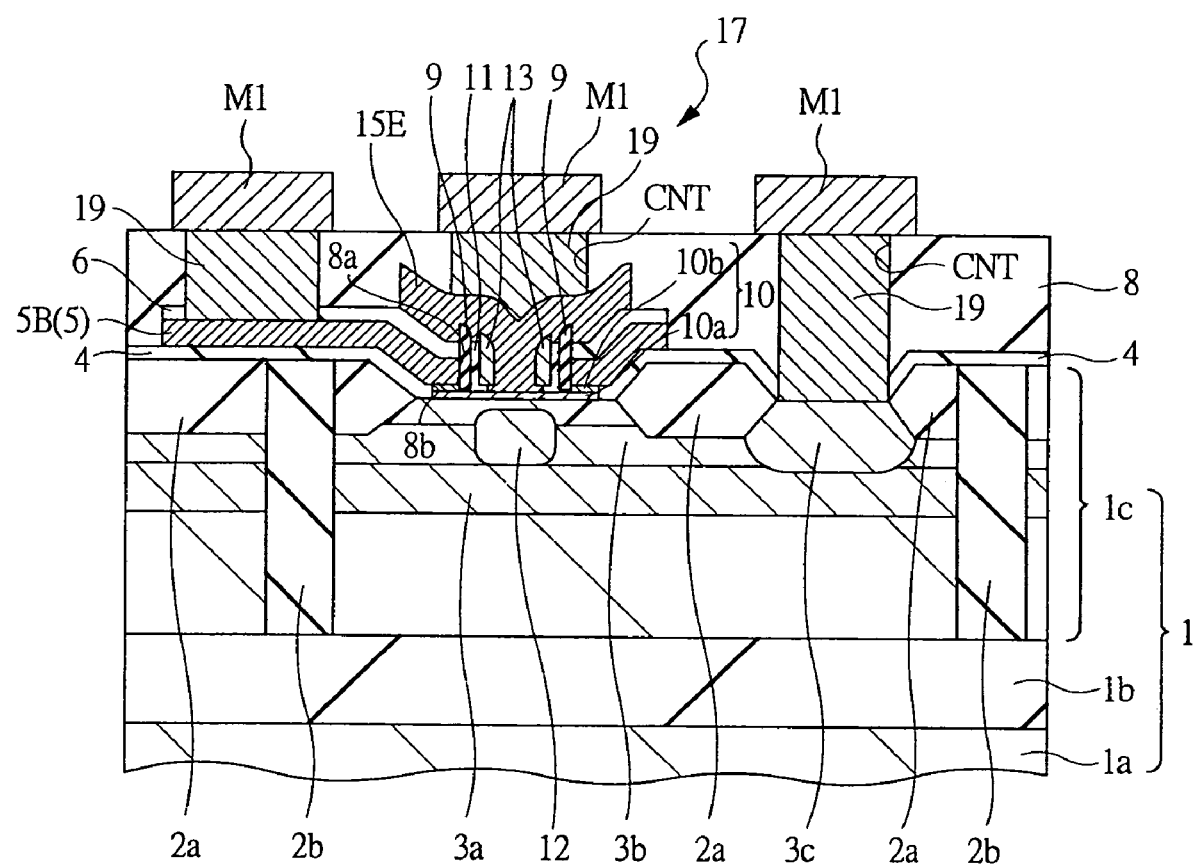
FIG. 15 is a sectional view showing a principal portion in the manufacturing process of the semiconductor device subsequently to FIG. 14.
Figure 16:
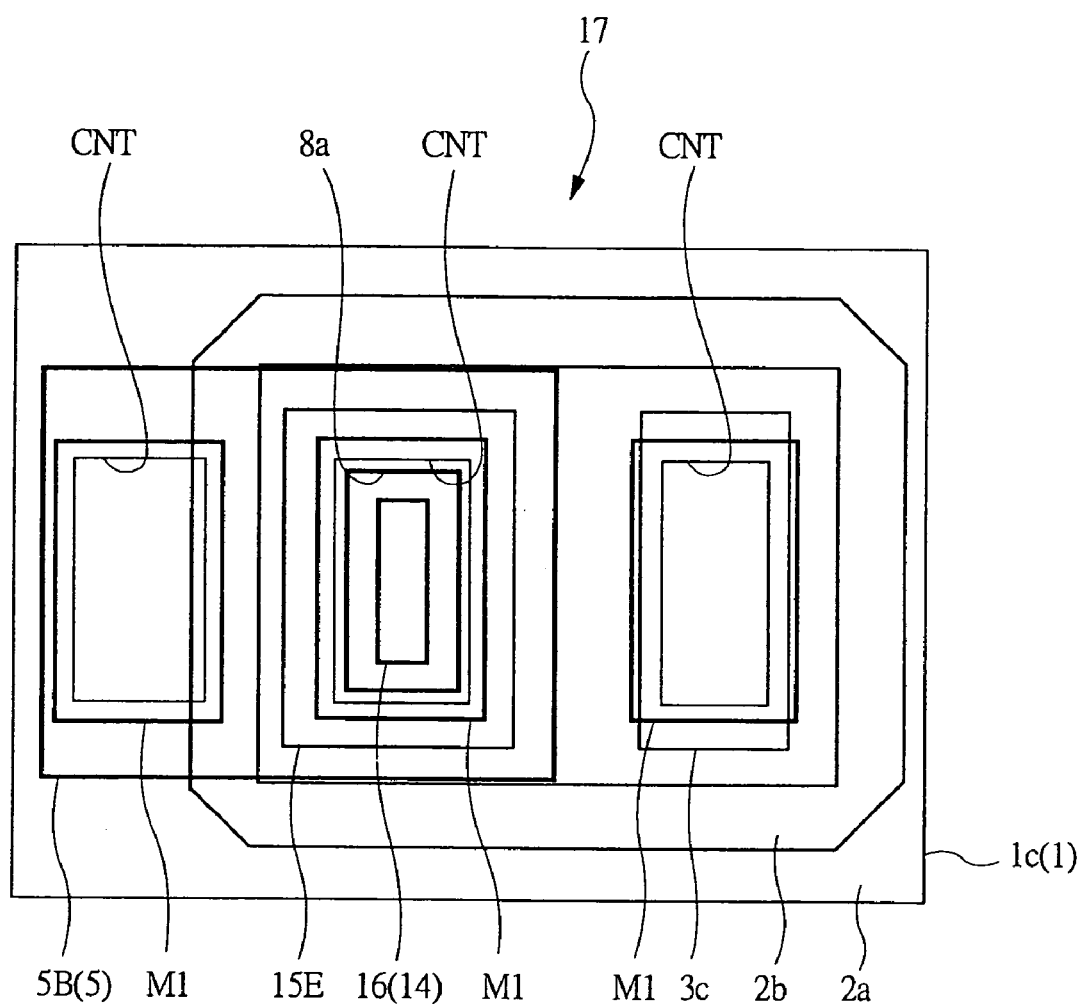
FIG. 16 is a plan view showing a principal portion in the manufacturing process of the semiconductor device of FIG. 15.

In this case, a manufacturing method for a semiconductor device having an npn-type HBT (hetero-junction bipolar transistor), which can achieve a high-speed operation, is illustrated. However, the present invention can be applied also to a manufacturing method for a semiconductor device having a pnp-type HBT. FIGS. 1 through 15 are sectional views showing a principal portion in the manufacturing process of a semiconductor device, and FIG. 16 is a plan view showing a principal portion of the semiconductor device of FIG. 15. As shown in FIG. 1, the semiconductor substrate (hereinafter abbreviated as "substrate") 1 is, for example, a nearly plane circular SOI (silicon on insulator) wafer. That is, the substrate 1 has a semiconductor layer 1c on a support substrate 1a via an insulation layer 1b. The support substrate 1a is made from, for example, single crystalline silicon (Si) and has a function to secure mechanical strength of the substrate 1. The insulation layer 1b is made from, for example, a silicon oxide ($SiO_x$) film. The semiconductor layer 1c is made from, for example, a single crystalline silicon layer and has a semiconductor layer formed with the semiconductor wafer and an upper semiconductor layer thereof formed by an epitaxial method. On a main surface of this semiconductor layer 1c (that is, the main surface of the substrate 1), a device is formed. In an isolation region of the main surface (device forming surface) of the semiconductor layer 1c, a shallow isolation 2a and a deep trench isolation 2b are formed. The shallow isolation 2a is made from a silicon oxide film formed by, for example, a LOCOS (local oxidization of silicon) method. By this isolation 2a, a plane range of an active region is defined. In addition, the deep trench isolation 2b is formed by embedding, for example, a silicon oxide film in a deep trench dug so as to reach the insulation layer 1b through the isolation 2a and the semiconductor layer 1c from the upper surface of the isolation 2a. By this deep trench isolation 2b, each device region in the semiconductor layer 1c is completely separated electrically. Note that the isolation 2a may be formed into a so-called shallow groove isolation (SGI) which is formed by embedding, for example, a silicon oxide film inside a shallow trench dug in the semiconductor layer 1c to such an extent as not to contact with the insulation layer 1b. In the semiconductor layer 1c of an HBT region, an $n^+$-type collector embedding region 3a is formed. In this collector embedding region 3a, for example, antimony (Sb) is contained. On an upper layer of the collector embedding region 3a, the $n^-$-type collector region (first semiconductor region) 3b and the $n^+$-type collector extraction region 3c are formed. In this collector region 3b and the collector extraction region 3c, for example, phosphorous (P) is contained. The collector region 3b and the collector extraction region 3c are separated by the isolation 2a provided therebetween and electrically connected through the collector embedding region 3a.

Figure 2:
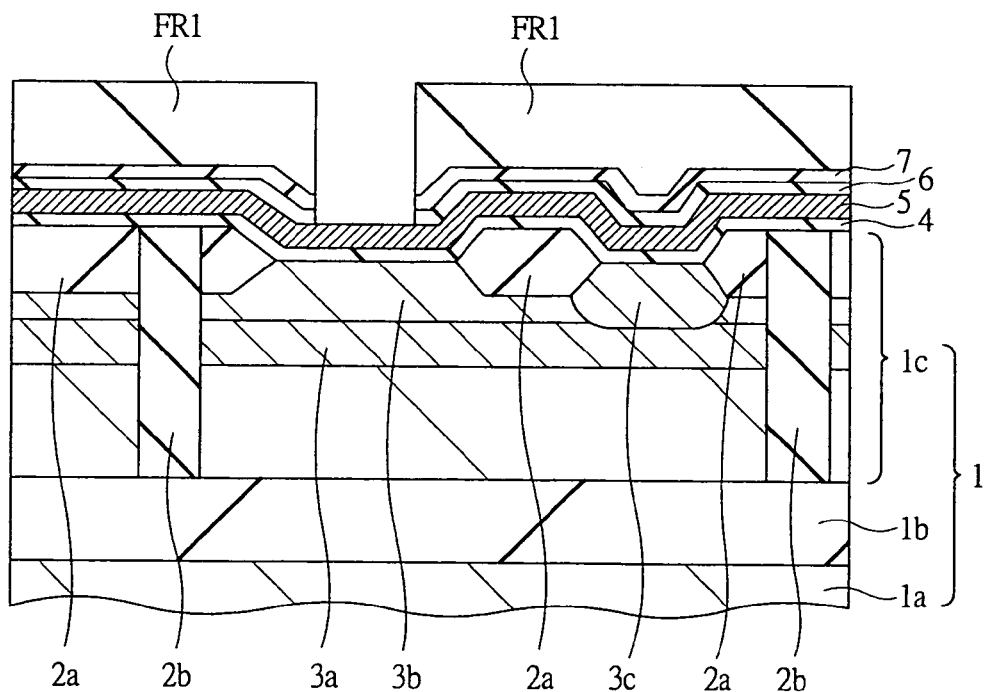
FIG. 2 is a sectional view showing a principal portion in the manufacturing process of the semiconductor device subsequently to FIG. 1.
Figure 3:
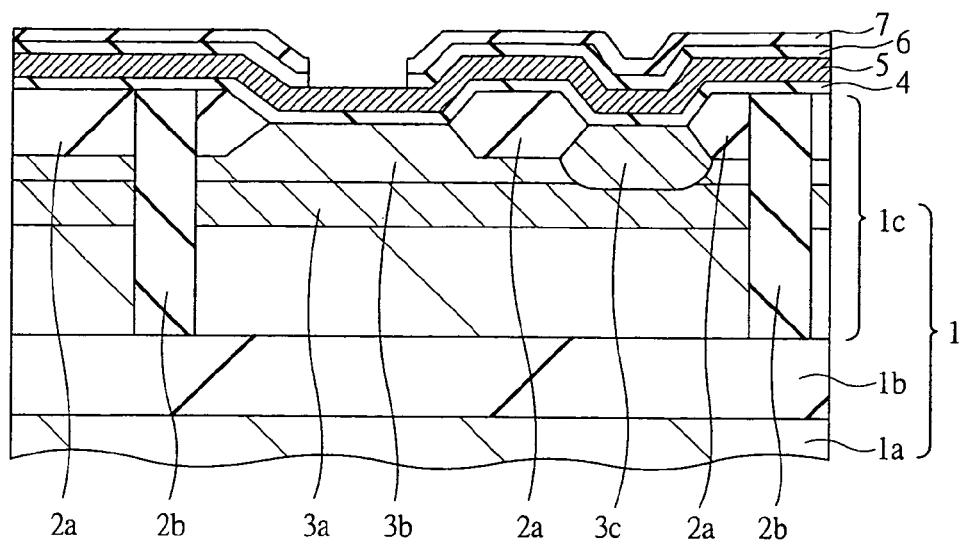
FIG. 3 is a sectional view showing a principal portion in the manufacturing process of the semiconductor device subsequently to FIG. 2.

First, on the main surface of this kind of substrate 1 (SOI wafer), an about 95 nm thick insulation film (first insulation film) 4 made from, for example, a silicon oxide film etc., an about 200 nm thick conductor film (first semiconductor film, first polycrystalline silicon film) 5 made from, for example, a $p^+$-type polycrystalline silicon film etc., an about 100 nm thick insulation film (second insulation film, third insulation film) 6 made from a silicon nitride film etc., and an about 100 nm thick insulation film (fifth insulation film) 7 made from a silicon oxide film etc. are stacked up successively in this order from the bottom layer by a CVD (chemical vapor deposition) process etc. Subsequently, on the insulation film 7, a photoresist pattern (hereinafter abbreviated as "resist pattern") FR1, from which the first opening forming region is exposed and with which other region except it is covered, is formed by a photo-lithography technique (hereinafter abbreviated as "lithography technique"). Thereafter, as shown in FIG. 2, the resist pattern FR1 is used as an etching mask and the insulation films 7 and 6 exposed from it are etched successively by an anisotropic dry-etching treatment. Upon completion of the etching, the resist pattern FR1 is removed by ashing etc., as shown in FIG. 3.

Figure 4:
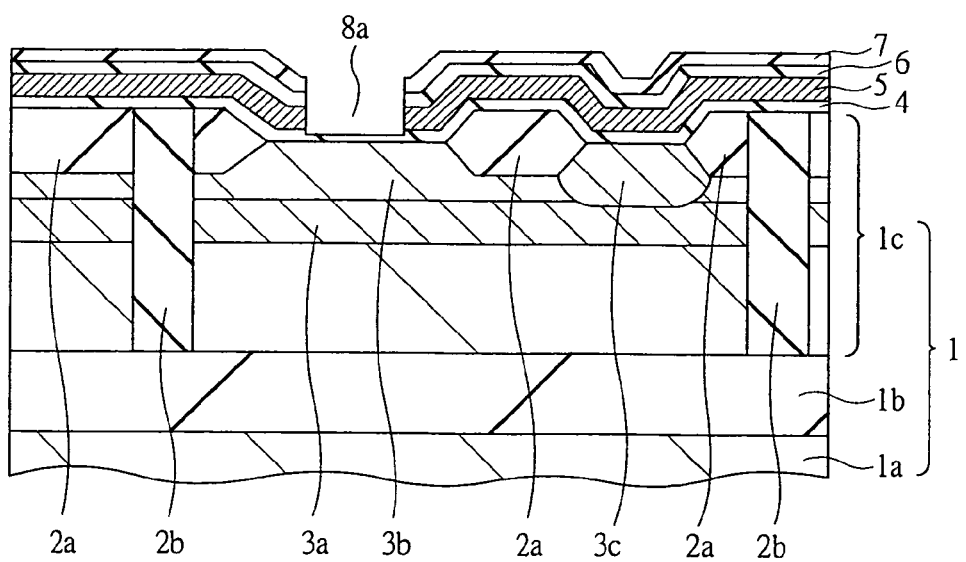
FIG. 4 is a sectional view showing a principal portion in the manufacturing process of the semiconductor device subsequently to FIG. 3.
Figure 5:
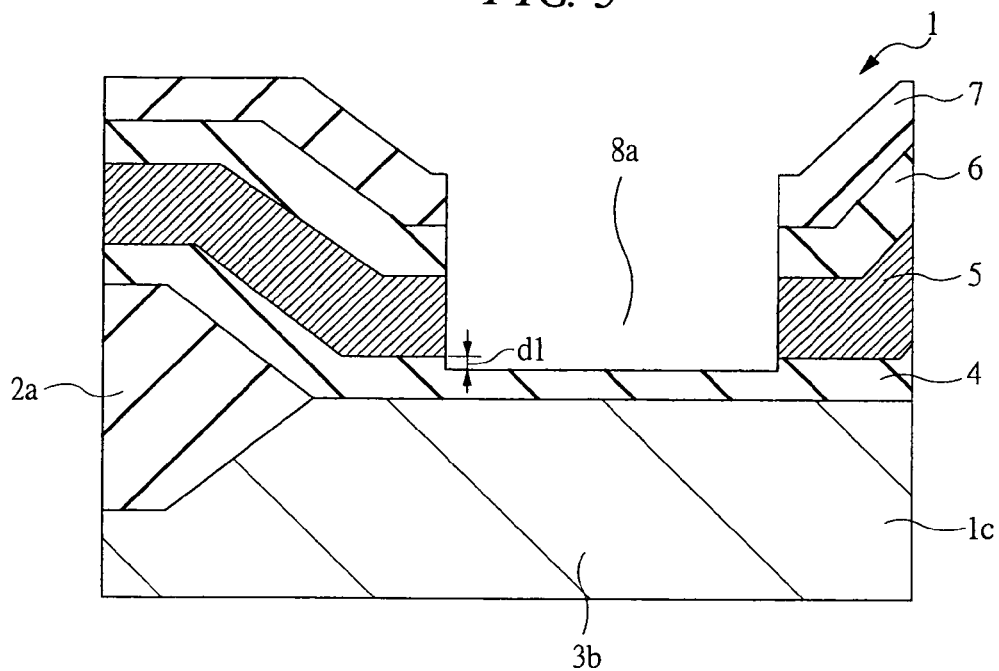
FIG. 5 is an enlarged sectional view showing a principal portion in the manufacturing process of the semiconductor device of FIG. 4.

Next, the uppermost insulation film 7 made from a silicon oxide film etc. is used as an etching mask (hard mask) and the conductor film 5 exposed therefrom is etched by an anisotropic dry-etching treatment to form the first opening portion 8a, as shown in FIG. 4. As described above, in the present embodiment, by using the insulation film 7 made from a silicon oxide film etc. as an etching mask in this etching treatment, the etching selective ratio of the conductor film 5 made from a polycrystalline silicon film etc. to the lower insulation film 4 made from a silicon oxide film etc. can be greatly improved than that in the case where the above-mentioned resist pattern is used as an etching mask. For example, even in the same high-density plasma etching apparatus, a selective ratio of the conductor film 5 to the insulation film 4 is 7 when the resist pattern is used as an etching mask, whereas the selective ratio is about three times greater when the insulation film 7 made from a silicon oxide film etc. is used as an etching mask, that is, can is increased up to 20. Consequently, a scraping amount of the upper portion of the insulation film 4 on the bottom surface of the first opening portion 8a can be eminently reduced. In addition, stability of the scraping amount of the upper portion of the insulation film 4 can be improved, whereby a processing with good reproducibility can be achieved. FIG. 5 is an enlarged sectional view of the principal portion of FIG. 4. In the present embodiment, the scraping amount d1 of the upper surface of the insulation film 4 on the bottom portion of the first opening portion 8a is set to be within a range of $0 < d1 \leq d2/2$ where "d2" denotes the thickness the insulation film 4 in a direction orthogonal to the main surface of the semiconductor layer 1c. That is, the scraping amount d1 is greater than 0 (zero) and is equal to or smaller than one half the thickness d2 of the insulation film 4. According to the examination of the present inventors, for example, when the about 200 nm thick conductor film 5 made from a polycrystalline silicon film etc. is etched, the scraping amount d1 of the insulation film 4 made from an about 100 nm thick silicon oxide film etc. has been capable of constantly being reduced to 20 nm or less. That is, the scraping amount d1 of the insulation film 4 can be reduced to ⅕ or less of the thickness d2 of the insulation film 4, whereby a sufficient margin can be secured. Note that the first opening portion 8a has a plane size of, for example, about 0.5 μm×about 2.0 μm.

Figure 6:
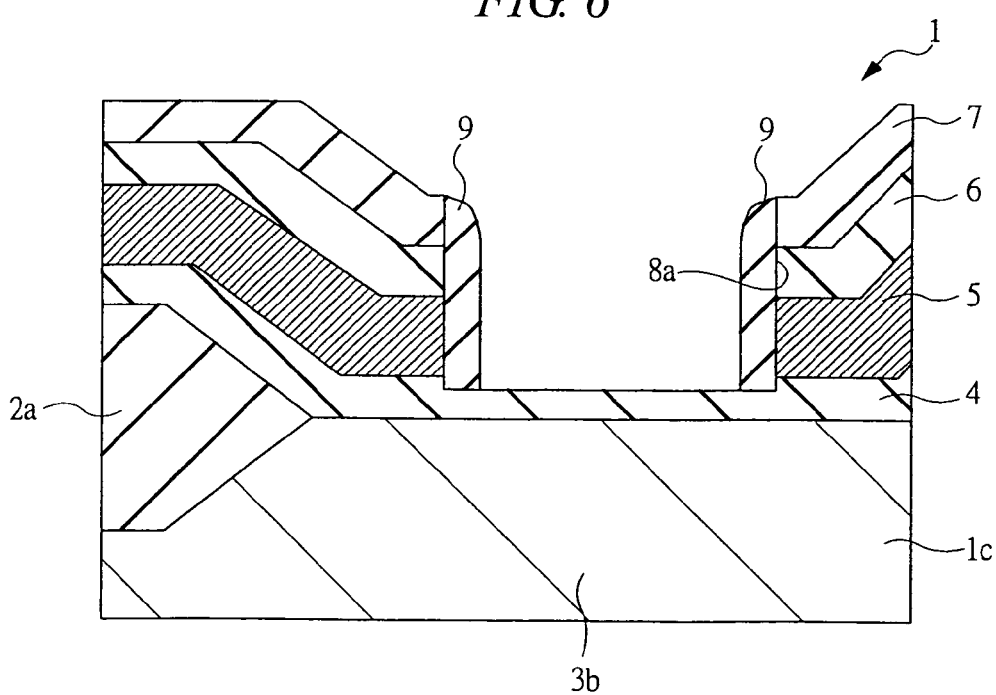
FIG. 6 is an enlarged sectional view showing a principal portion in the manufacturing process of the semiconductor device subsequently to FIG. 5.
Figure 7:
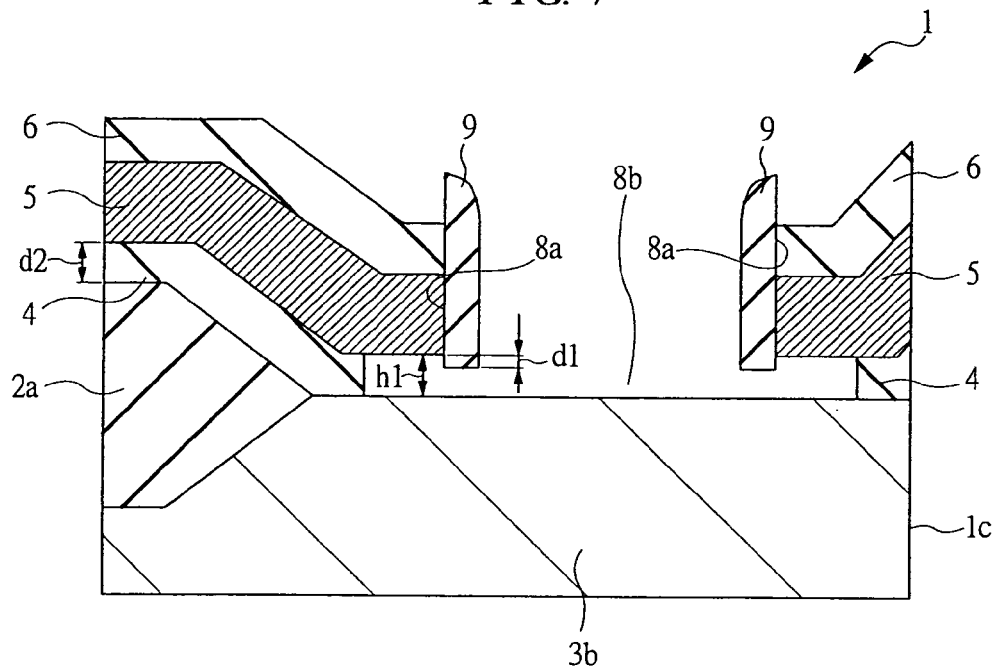
FIG. 7 is an enlarged sectional view showing a principal portion in the manufacturing process of the semiconductor device subsequently to FIG. 6.

Then, an about 50 nm thick insulation film made from, for example, a silicon nitride film etc. is deposited over the main surface of the substrate 1 (SOI wafer) by a CVD process etc., and then the insulation film is etch-backed by an anisotropic dry-etching method, and, as shown in FIG. 6, sidewall insulation films (second insulation film, fourth insulation film, and sixth insulation film) 9 are formed on inner surfaces (first surface and third surface) of the first opening portion 8a. Subsequently, a wet-etching treatment is performed to the substrate 1 by, for example, hydrofluoric acid (HF) to remove a portion of the insulation film 4 through the first opening portion 8a, and the second opening portion (opening portion) 8b greater in a plane size than the first opening portion 8a is, as shown in FIG. 7, formed so as to communicate with the first opening portion 8a. From the inside of the second opening portion 8b, a portion of the main surface (active region) of the semiconductor layer 1c is exposed. In addition, by this etching treatment, an over-etching treatment is performed so that the etching of the insulation film 4 extends even to a portion of the lower side of the conductor film 5, that is, undercut is formed. Consequently, an end portion of the conductor film 5 is protruded and extends like eaves from an outer circumferential end of the second opening portion 8b toward the center of the second opening portion 8b, and a surface opposite to the substrate 1 (second surface) is exposed from a protruded portion thereof. In addition, in the present embodiment, a lower end portion of the sidewall-insulation film 9 is slightly protruded from the second surface of the conductor film 5 toward the main surface of the semiconductor layer 1c. That is, a portion of the sidewall-insulation film 9 is slightly protruded to a side of the second opening portion 8b. The protrusion amount on a lower end side of this sidewall-insulation film 9 corresponds to the above-mentioned scraping amount d1. That is, the protrusion amount on the lower end side of the sidewall-insulation film 9 is greater than 0 (zero) and is equal to or smaller than one half the thickness d2 of the insulation film 4. The thickness of this insulation film 4 corresponds to height h1 (height of the second opening portion 8b) from the main surface of the semiconductor layer 1c to the lower surface of the protruded portion of the conductor film 5 in the second opening portion 8b. In addition, since the insulation film 7 is made from the same silicon oxide film as the insulation film 4, it is all removed by the wet-etching treatment. However, in the present embodiment, at this stage, the insulation film 6 made from a silicon nitride film etc. is deposited on the upper surface of the conductor film 5 and further the sidewall-insulation film 9 made from a silicon nitride film etc. is formed on the side surfaces (first surface and third surface) of the conductor film 5 and the insulation film 6 in the first opening portion 8a in such a manner to cover the entirety of them. In this case, the sidewall-insulation film 9 is formed so as to overlap with a side surface (third surface) of the insulation film 6 in the first opening portion 8a with its upper portion being protruded from the upper surface of the insulation film 6. Thus, since the upper surface of the conductor film 15 and the inner surfaces (first surface and third surface) of the first opening portion 8a are tightly covered with the insulation film 6 and the sidewall-insulation film 9 made from a silicon nitride film, the above-mentioned wet-etching treatment can be satisfactorily performed. Consequently, since a hydrogen-terminated and chemically stable surface of silicon of the semiconductor layer 1c can be more successfully exposed, effects due the hydrogen-terminated surface can be still more effectively exerted during the subsequent growth of the dissimilar crystalline layer, whereby satisfactory crystal growth can be promoted.

Figure 8:
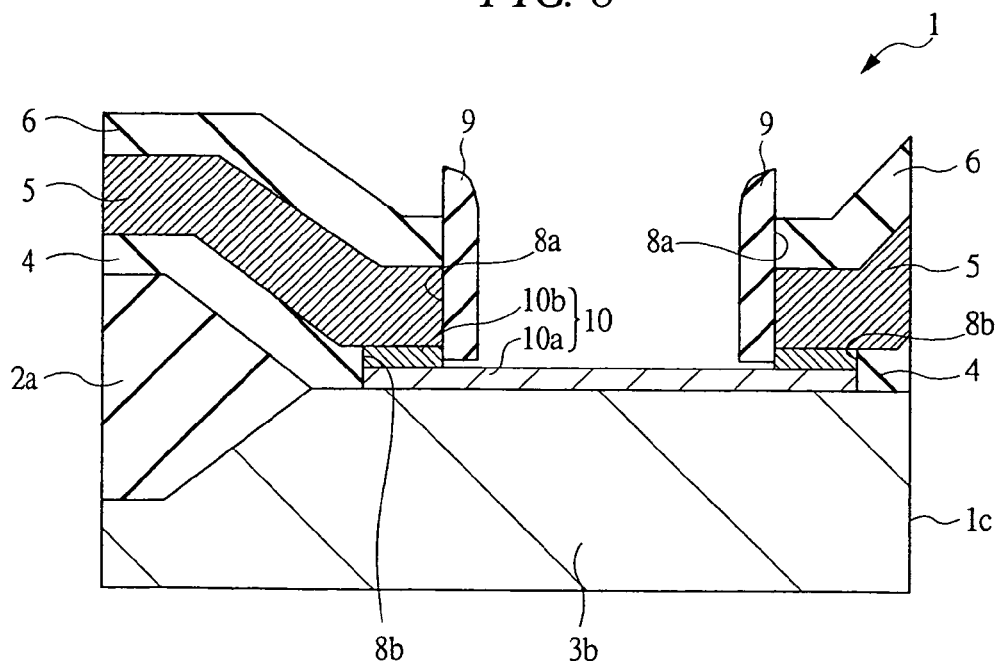
FIG. 8 is an enlarged sectional view showing a principal portion in the manufacturing process of the semiconductor device following FIG. 9.

Next, after housing the substrate 1 (SOI wafer) in a chamber of an epitaxial growing apparatus for a dissimilar crystal growth treatment, annealing is performed for a short time by a lamp-annealing method etc. in an atmosphere containing a reducing gas such as a hydrogen gas. This heating treatment is also called a "reducing cleaning treatment", and a primary purpose thereof intends to remove the silicon oxide film on the dissimilar crystal growing surface (main surface of the semiconductor layer 1c) by a reduction reaction etc. and expose a clean silicon surface on the crystal growing surface. Subsequently, as shown in FIG. 8, in the treatment chamber of the epitaxial growing apparatus, the dissimilar crystalline layer (semiconductor film) 10 such as silicon-germanium (SiGe) is mad to selectively epitaxial-grow on the semiconductor layer 1c of the substrate 1 (SOI wafer) by, for example, a LP-CVD (low pressure-chemical vapor deposition) method. At the time of this selective SiGe growth, for example, $SiH_2Cl_2$, $SiH_4$, HCl, $GeH_4$, $B_2H_6$, $H_2$, or the like is used as a material gas. In this growth treatment, a single crystalline layer (third semiconductor film) 10a grows on the main surface of the semiconductor layer 1c, and a polycrystalline layer (second semiconductor layer) 10b grows on an exposed surface (second surface) of the portion of the upper surface side of the conductor film 5, and these films are joined to form the dissimilar crystalline layer 10. The single crystalline layer 10a has, for example, an i (intrinsic)-SiGe layer, a p-type SiGe layer, and an i (intrinsic)-Si layer which are made to grow in this order from the lower layer. The p-type SiGe layer of this single crystalline layer 10a is a portion which becomes an HBT base region (true base region). In this p-type SiGe layer, for example, boron is introduced, and the concentration thereof is, for example, about $2 \times 10^{19}$ $cm^{-3}$. In addition, the uppermost i-Si layer is a portion at which the HBT emitter region is basically formed. Meanwhile, the polycrystalline layer 10b is a portion that becomes a link-base portion formed by the growth of polycrystalline SiGe. The growth is finished at the time when these single crystalline layer 10a and polycrystalline layer 10b are connected to each other. At this time, in the present embodiment, growth of the dissimilar crystalline layer 10, in particular, growth of the polycrystalline layer 10b is not blocked, by setting so that the protrusion amount on the lower end side of the sidewall-insulation film 9 is equal to or smaller than one half the thickness d2 of the insulation film 4. Consequently, the polycrystalline layer 10b can be made to successfully grow. Accordingly, since the polycrystalline layer 10b and the single crystalline layer 10a can be securely connected, the contact resistance at the HBT link-base portion (portion of the polycrystalline layer 10b) can be considerably reduced. In addition, if the upper surface of the conductor film 5 or a side surface of the first opening portion 8a is exposed even partially, the dissimilar crystalline layer is made to grow from the exposed surface at the time of the growth of the dissimilar crystalline layer. In particular in the conductor film 5, since upper corners on a side of the first opening portion 8a are easily exposed, the unnecessary dissimilar crystalline layer is made to grow therefrom in some cases. The growth of this unnecessary dissimilar crystalline layer causes short-circuit failure between a base and an emitter. As against this, in the present embodiment, the sidewall-insulation film 9 is formed so as to overlap with side surfaces of the insulation film 6 and the conductor film 5 in the first opening portion 8a, and the sidewall-insulation film 9 is provided so as to securely cover the upper surface of the conductor film 5 and the inner surface of the first opening portion 8a. Therefore, it is possible to prevent the dissimilar crystalline layer 10 from growing at some unnecessary places. That is, selective growth of the dissimilar crystalline layer 10 can be satisfactorily performed. Note that the resistance of the conductor film 5 is reduced by being further diffused to such an extent that the impurity (boron) in the conductor film 5 for forming the base electrode reaches the insulation film 4 during the selective growth of the dissimilar crystalline layer 10.

However, main elements of the dissimilar crystalline layer 10 are not limited to SiGe and can be variously altered and, for example, Si or silicon-germanium-carbon (SiGeC) may be used. If Si is used, i (intrinsic)-Si, P-type Si, and i (intrinsic)-Si are made to grow subsequently in this order from the lower layer to form the single crystalline layer 10a of the dissimilar crystalline layer 10. In addition, if SiGeC is used, i (intrinsic)-SiGeC, P-type SiGeC, and i (intrinsic)-Si are made to grow subsequently in this order from the lower layer to form the single crystalline layer 10a of the dissimilar crystalline layer 10. If the main element of the dissimilar crystalline layer 10 is a SiGe layer, cutoff frequency characteristics (fT) and current gain (hFE) can be improved as compared to the case in which Si is used. In addition, when Si is used, the temperature characteristics can be improved. Furthermore, if SiGeC is used, a concentration of Ge can be increased as compared to the case in which SiGe is used. Therefore, the cutoff frequency characteristics (fT) and the current gain (hFE) can be further improved.

Figure 9:
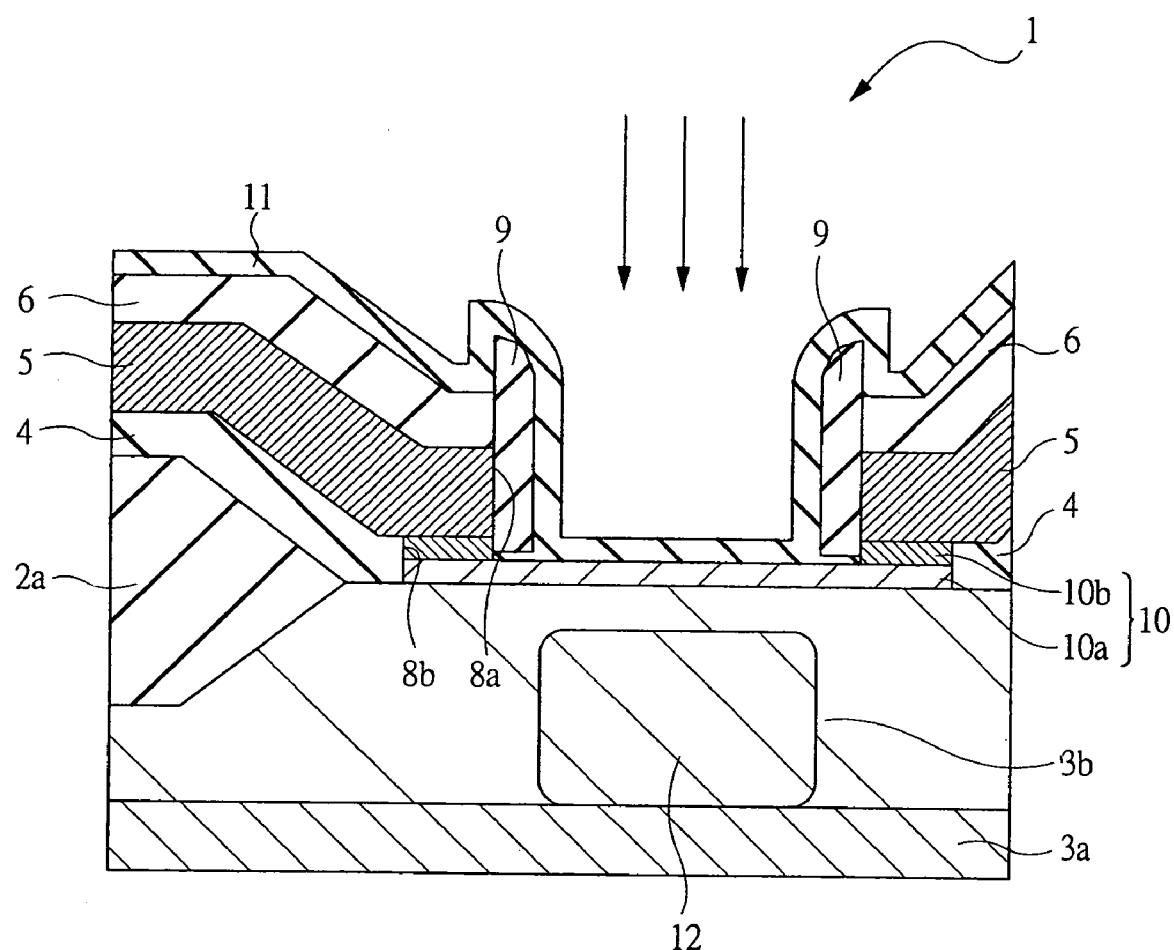
FIG. 9 is an enlarged sectional view showing a principal portion in the manufacturing process of the semiconductor device subsequently to FIG. 8.
Figure 10:
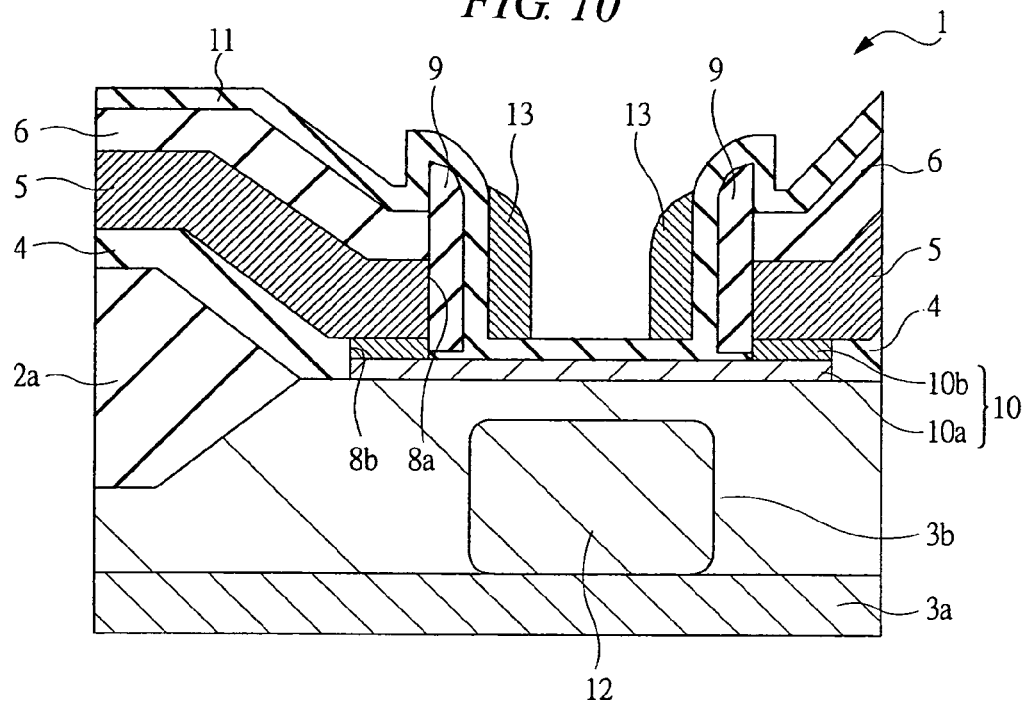
FIG. 10 is an enlarged sectional view showing a principal portion in the manufacturing process of the semiconductor device subsequently to FIG. 9.
Figure 11:
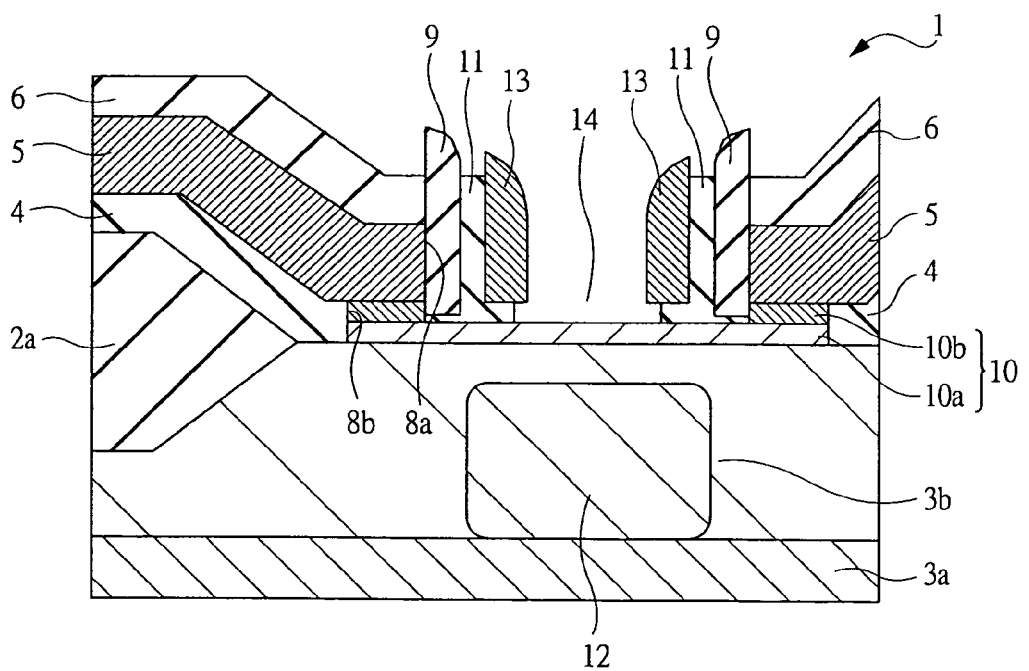
FIG. 11 is an enlarged sectional view showing a principal portion in the manufacturing process of the semiconductor device subsequently to FIG. 10.

Next, as shown in FIG. 9, after depositing an insulation film (seventh insulation film) 11 made from, for example, a silicon oxide film etc. on the main surface of the substrate 1 (SOI wafer) by a CVD process etc., the true collector region right below the base is selectively increased up to a high concentration by using this insulation film 11 as a through film and by ion-injecting, for example, phosphorus (P) into the semiconductor layer 1c. This ion-injection treatment is a treatment for forming an SIC (selective implanted collector) region 12 in the semiconductor layer 1c. Thereby, the HBT frequency characteristics can be improved. In addition, the collector resistance can be reduced, too. Subsequently, for example, a low-resistance polycrystalline silicon film is deposited on the main surface of the substrate 1 by a CVD process etc., and thereafter is etched back by an anisotropic dry-etching method to form a sidewall-conductor film (fifth semiconductor film) 13 made from a low-resistance polycrystalline silicon film etc. on the side surface of the first opening portion 8a via the sidewall-insulation film 9 and the insulation film 11, as shown in FIG. 10. At this time, since the surface of the dissimilar crystalline layer 10 is protected by the insulation film 11, damage by dry-etching can be prevented. Thereafter, the wet-etching treatment is performed to the substrate 1 and the insulation film 11 exposed from the sidewall-conductor film 13 is selectively etched as shown in FIG. 11, whereby an emitter opening portion (third opening portion) 14 is formed. From the emitter opening portion 14, the single crystalline layer 10a of the dissimilar crystalline layer 10 is exposed. Since the emitter opening portion 14 is formed by a wet-etching treatment, the exposed surface of the dissimilar crystalline layer 10 is not subject to damage.

Figure 12:
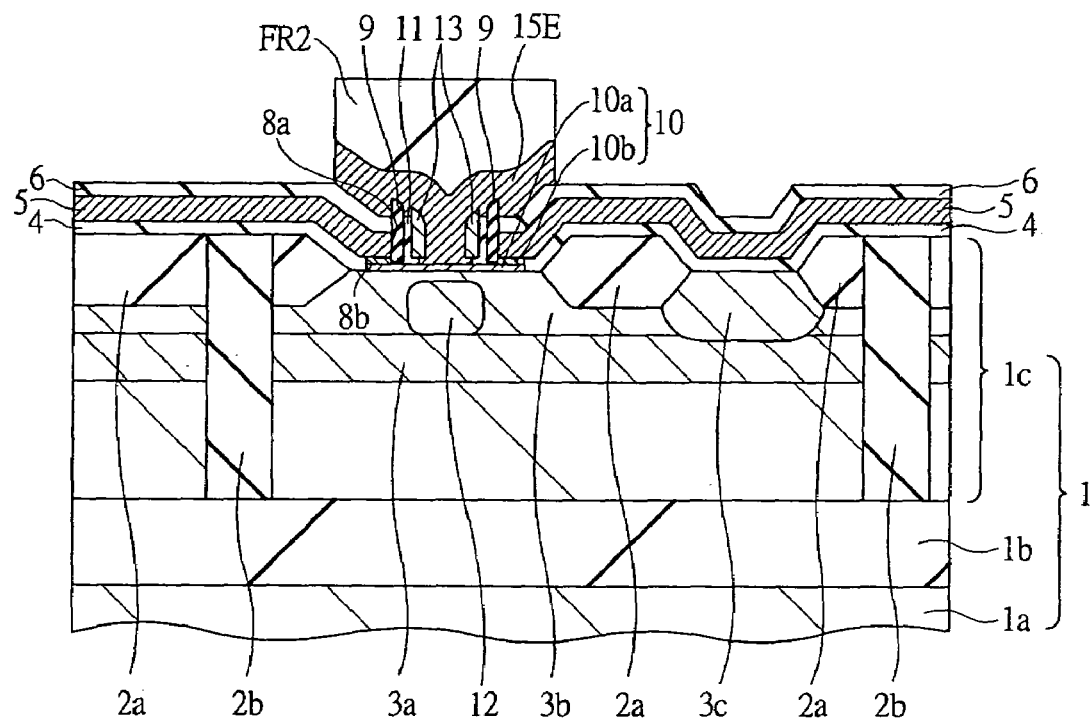
FIG. 12 is a sectional view showing a principal portion in the manufacturing process of the semiconductor device subsequently to FIG. 11.
Figure 13:
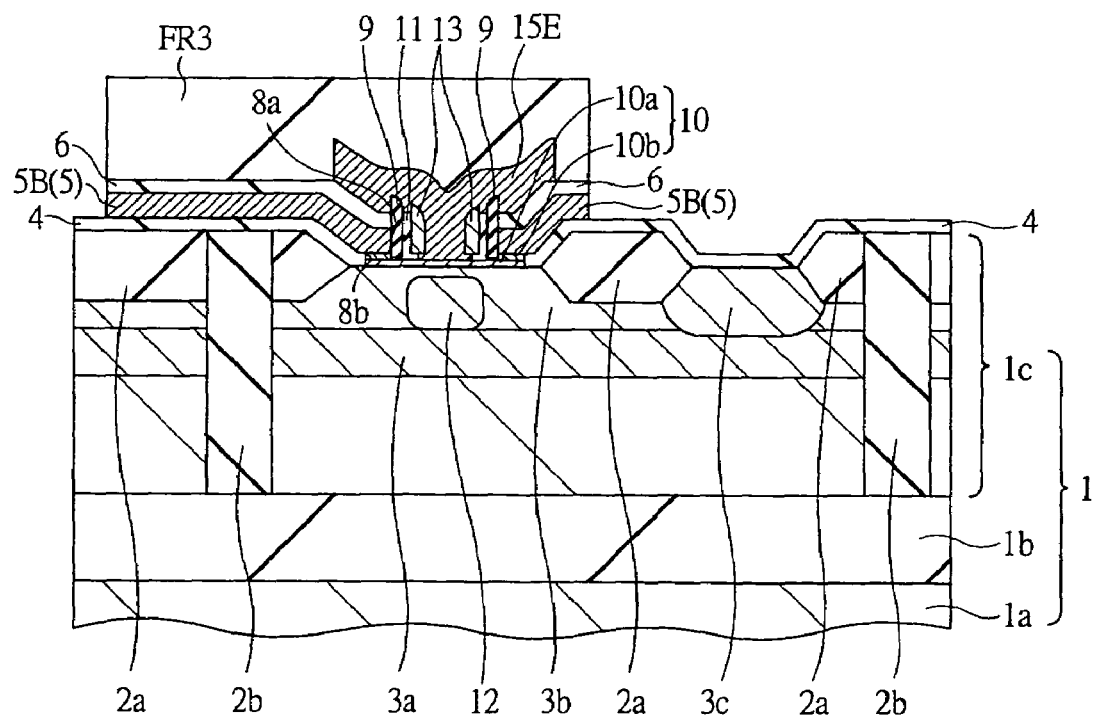
FIG. 13 is a sectional view showing a principal portion in the manufacturing process of the semiconductor device subsequently to FIG. 12.
Figure 14:
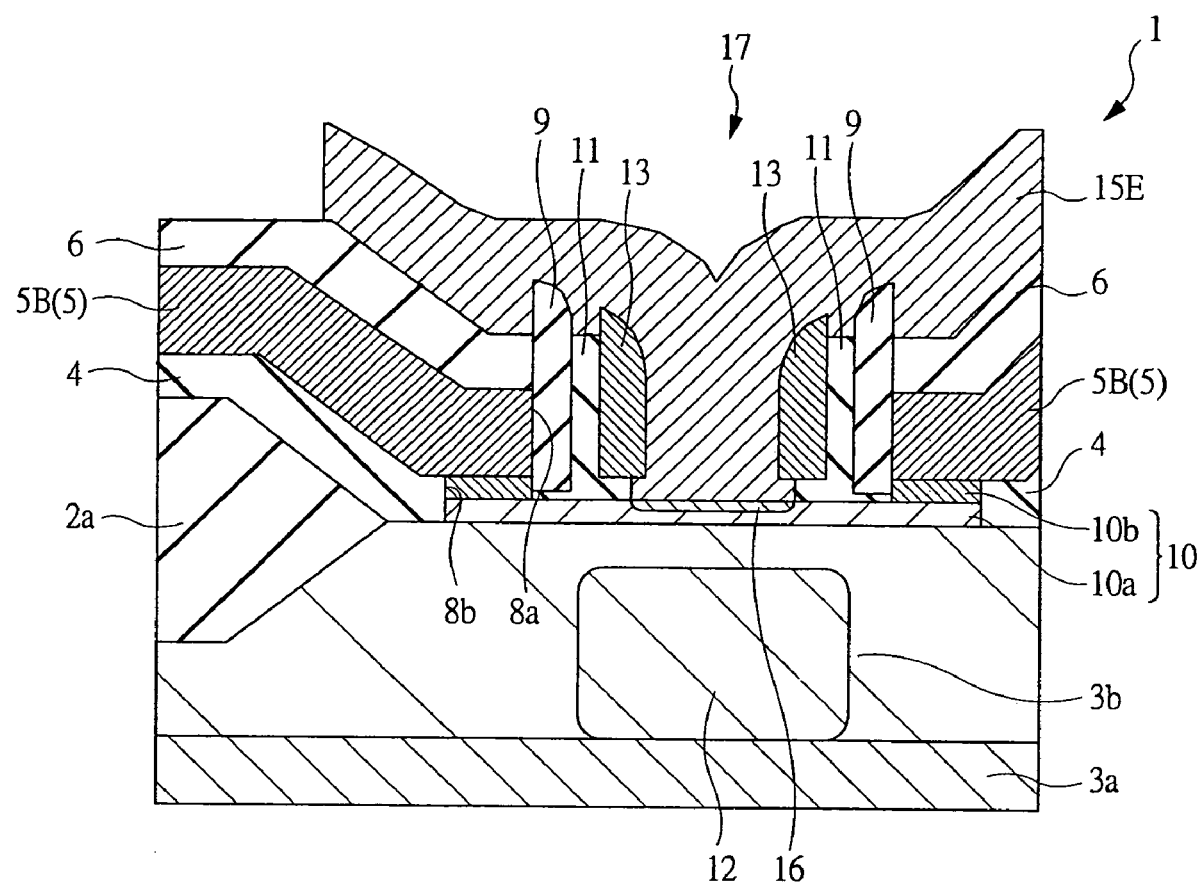
FIG. 14 is an enlarged sectional view showing a principal portion in the manufacturing process of the semiconductor device subsequently to FIG. 13.

Then, on the main surface of the substrate 1 (SOI wafer), a conductor film made from a phosphorus-doped polycrystalline silicon film having a thickness of, for example, about 250 nm is deposited on a side of the main surface of the substrate 1 by a CVD method. Then, as shown in FIG. 12, the conductor film is processed by a dry-etching method using a resist pattern FR2 as an etching mask to form emitter extraction electrodes (fourth semiconductor film, sixth semiconductor film, second electrode, and emitter electrode) 15E. The bottom surface of the emitter extraction electrode 15 contacts with the above-mentioned i-Si layer of the dissimilar crystalline layer 10 through the emitter opening portion 14. Subsequently, the resist pattern FR2 is removed by ashing and thereafter, as shown in FIG. 13, the insulation film 6 and the conductor film 5 are etched by a dry-etching method using a resist pattern FR3 as an etching mask to form base extraction electrodes (first semiconductor layer, first electrode, first polycrystalline silicon film, and base electrode) 5B. In the present embodiment, the upper surface of the base extraction electrode 5B and the side surface of the first opening portion 8a are securely covered with the insulation film 6 and the sidewall-insulation film 9, respectively. Therefore, it is possible to sufficiently secure withstand resistance between the base extraction electrode 5B and the emitter extraction electrode 15E and to prevent short-circuit failure between these electrodes. Subsequently, after removing the resist pattern FR3, a heat treatment is performed to the substrate 1 (SOI wafer) at, for example, 900° C. for about 30 seconds. Thereby, phosphorus in the emitter extraction electrode 15E is diffused in the i-Si layer of the dissimilar crystalline layer 10 and, as shown in FIG. 14, a single crystalline emitter region 16 is formed at an upper portion (a region contacting with the emitter extraction electrode 15E) of the dissimilar crystalline layer 10. The HBT17 is thus formed on the substrate 1 (SOI wafer). Thereafter, as shown in FIGS. 15 and 16, after depositing the insulation film 18 made from, for example, a silicon oxide film etc. on the main surface of the substrate 1 by a CVD method etc., contact holes CNT are formed on the insulation film 18 to expose the base extraction electrode 5B, the emitter extraction electrode 15E, and the collector extraction region 3c.

Next, for example, tungsten (W) is deposited on the main surface of the substrate 1 (SOI wafer) by a CVD process etc. and then is scraped by a CMP or etch-back method, so that plugs 19, each made from tungsten etc., are formed in the contact holes CNT. Subsequently, on the main surface of the substrate 1 (SOI wafer), a barrier conductor film such as titanium tungsten (TiW), an aluminum-based, relatively thick main conductor film such as aluminum-silicon-copper alloy, and a barrier conductor film such as titanium tungsten are deposited subsequently in this order from the lower layer by a sputtering method etc. Thereafter, since a laminated conductor film thereof is patterned by a lithography technique and a dry-etching method, first layer wirings M1 are formed. Note that since FIG. 16 shows a design drawing, each planar shape of the emitter opening portion 14, the first opening portion 8a, and the contact holes CNT, etc. is shown in a rectangular shape. However, such shapes actually become ones without corners.

Thus, according to the present embodiment, the base resistance (in particular, connection resistance between the link-base portion and the base extraction electrode 5B) can be greatly reduced. Also, insulative resistance properties between the base extraction electrode 5B and the emitter extraction electrode 15E can be satisfactorily secured and the short-circuit failure between these electrodes can be prevented. Therefore, performance, reliability, and yield of the semiconductor device having the HBT 17 can be greatly improved.

As described above, the invention made by the inventors has been specifically described based on the embodiment. However, needless to say, the present invention is not limited to the above embodiment and can be variously altered and modified without departing from the gist thereof.

For example, the description has been made of the case where the substrate comprises the SOI wafer. However, the substrate is not limited to this case and can be variously changed and may be, for example, a regular substrate constituted by a semiconductor or an epitaxial substrate having an epitaxial layer provided on a surface of a semiconductor substrate.

In the above-mentioned description, there has been described the case where the invention made by the present inventors is mainly applied to the manufacturing method for the semiconductor device having the HBT, which is the background and the applicable field of the invention. However, the invention is not limited to this case and can be applied to a manufacturing method for a semiconductor device that provides, for example, a HBT and other elements to the same substrate. In addition, the invention is not limited to application to the telecommunication equipment and, for example, can be applied to other information processing equipment such as computers or digital cameras.

INDUSTRIAL APPLICABILITY

The present invention is useful as a manufacturing method of a semiconductor device which constitutes telecommunication equipment such as optical transmission systems and cellular phones or as a manufacturing method of a semiconductor device which constitutes information processing equipment such as computers and digital cameras, and, in particular, is suitable for the use as a manufacturing method of a semiconductor device having a HBT.

The invention claimed is:

1. A manufacturing method for a semiconductor device, comprising the steps of:
   (a) forming a first semiconductor region of a first conductivity type over a semiconductor substrate;
   (b) depositing a first insulation film over a main surface of said semiconductor substrate;
   (c) depositing a first semiconductor film of a second conductivity type opposite to said first conductivity type over said first insulation film;
   (d) depositing a third insulation film of a kind different from said first insulation film over said first semiconductor film;
   (e) depositing a fifth insulation film capable of taking an etching selective ratio to said third insulation film over said third insulation film;
   (f) opening portions of said fifth insulation film and third insulation film by an etching method using a photoresist film as an etching mask;
   (g) removing said photoresist film, and thereafter removing said first semiconductor film exposed from the opening by using said fifth insulation film as an etching mask to form a first opening portion in said third and fifth insulation films and said first semiconductor film;
   (h) forming a sixth insulation film of a kind different from said first insulation film over a side surface of said first opening portion;
   (i) forming, over said first insulation film, a second opening portion in which a surface opposite to the main surface of said semiconductor substrate and said first semiconductor region in said first semiconductor film are exposed, by selectively etching a portion of said first insulation film through said first opening portion using said third insulation film and sixth insulation film as etching masks; and
   (j) forming a semiconductor film in said second opening portion,
   wherein said semiconductor film is formed by joining a second semiconductor film growing from a surface exposed from said second opening portion of said first semiconductor film and a third semiconductor film growing from the main surface of said semiconductor substrate,
   wherein said second semiconductor film is a poly crystal and said third semiconductor film is a single crystal, and
   wherein, during a processing for forming said first opening portion, an amount in which a portion of said first insulation film exposed from said first opening portion is etched and a protrusion amount of said sixth insulation film protruding from a surface opposite to the main surface of said semiconductor substrate toward the main surface of said semiconductor substrate in said first semiconductor film are each set to be equal to or smaller than one half of thickness of said first insulation film.

2. The manufacturing method for a semiconductor device according to claim 1, further comprising the steps of:
   (k) depositing a seventh insulation film over the main surface of said semiconductor substrate after said step (j); and
   (l) forming a fifth semiconductor film of the first conductivity type via said sixth and seventh insulation films over the side surface of said first opening portion by a dry-etching method.

3. The manufacturing method for a semiconductor device according to claim 2, further comprising:
   (m) removing, by the wet-etching method, said seventh insulation film exposed from said fifth semiconductor film in said first opening portion after the step (l), and forming a third opening portion from which a portion of said third semiconductor film in said seventh insulation film is exposed; and
   (n) forming a sixth semiconductor film contacting with said semiconductor film and insulated from said first semiconductor film after said step (m).

4. The manufacturing method for a semiconductor device according to claim 3,
   wherein said first semiconductor region is a collector region of a bipolar transistor, said first semiconductor film is a base electrode of said bipolar transistor, and said sixth semiconductor film is an emitter electrode of said bipolar transistor.

5. The manufacturing method for a semiconductor device according to claim 1,
   wherein said first and fifth insulation films are made from silicon oxide films and said third insulation film and sixth insulation film are made from silicon nitride films.

6. The manufacturing method for a semiconductor device according to claim 1,
   wherein said semiconductor film is made from a material containing primarily a semiconductor of a kind different from said semiconductor substrate.

7. The manufacturing method for a semiconductor device according to claim 6,
   wherein said semiconductor film is made from a material containing primarily silicon-germanium.

8. The manufacturing method for a semiconductor device according to claim 1,
   wherein said fifth insulation film is made from an insulative material of the same kind as said first insulation film.

9. A manufacturing method for a semiconductor device, comprising the steps of:
   (a) forming a collector region of a first conductivity type of a bipolar transistor over a semiconductor substrate;

(b) depositing a first insulation film made from a silicon oxide film over a main surface of said semiconductor substrate;

(c) depositing a first semiconductor film that is a conductive film for forming said bipolar transistor over said first insulation film, the first semiconductor film being for forming a base electrode of a second conductivity type opposite to said first conductivity type;

(d) depositing a third insulation film made from a silicon nitride film over said first semiconductor film;

(e) depositing a fifth insulation film made from a silicon oxide film over said third insulation film;

(f) opening portions of said fifth insulation film and third insulation film by an etching method using a photoresist film as an etching mask;

(g) removing said photoresist film, thereafter removing said first semiconductor film exposed from the opening by using said fifth insulation film as an etching mask, and forming a first opening portion in said third and fifth insulation films and said first semiconductor film;

(h) forming a sixth insulation film made from a silicon nitride film over a side surface of said first opening portion;

(i) forming, in said first insulation film, a second opening portion, from which a surface opposite to the main surface of said semiconductor substrate and said collector region in said first semiconductor film are exposed, by selectively etching a portion of said first insulation film through said first opening portion using said third insulation film and sixth insulation film as etching masks; and (j) forming, in said second opening portion, a second polycrystalline semiconductor film growing from a surface exposed from said second opening portion of said first semiconductor film and forming a link base of said bipolar transistor and a third single crystalline semiconductor film growing from the main surface of said semiconductor substrate and forming a true base region and emitter region of said bipolar transistor, by an epitaxial growth method so that they are joined to each other, wherein, during a processing for forming said first opening portion, an amount in which a portion of said first insulation film exposed from said first opening portion is exposed and a protrusion amount of said sixth insulation film protruded from a surface opposite to the main surface of said semiconductor substrate toward the main surface of said semiconductor substrate in said first semiconductor film are equal to or smaller than one half of thickness of said first insulation film.

10. The manufacturing method for a semiconductor device according to claim 9, further comprising the steps of:

(k) depositing a seventh insulation film over the main surface of said semiconductor substrate after said step (j); and (l) forming a fifth semiconductor film of the first conductivity type via said sixth insulation film and seventh insulation film over the side surface of said first opening portion by a dry-etching method.

11. The manufacturing method for a semiconductor device according to claim 10, further comprising the steps of:

(m) removing, in said first opening portion, said seventh insulation film exposed from said fifth semiconductor film by the wet-etching method after said step (l), and forming a third opening portion, from which a portion of said third semiconductor film is exposed, over said seventh insulation film; and (n) forming a sixth semiconductor film for forming the emitter electrode, which contacts with said third semiconductor film and is insulated from said first semiconductor film after said step (m).

* * * * *